US00RE49989E

(19) United States
(12) Reissued Patent
Richardson et al.

(10) Patent Number: US RE49,989 E
(45) Date of Reissued Patent: May 28, 2024

(54) COMMUNICATION TECHNIQUES INVOLVING PAIRWISE ORTHOGONALITY OF ADJACENT ROWS IN LPDC CODE

(71) Applicant: QUALCOMM Incorporated, San Diego, CA (US)

(72) Inventors: Thomas Joseph Richardson, South Orange, NJ (US); Joseph Binamira Soriaga, San Diego, CA (US); Shrinivas Kudekar, Roswell, GA (US); Gabi Sarkis, San Diego, CA (US)

(73) Assignee: QUALCOMM Incorporated, San Diego, CA (US)

(21) Appl. No.: 17/334,608

(22) Filed: May 28, 2021

Related U.S. Patent Documents

Reissue of:
(64) Patent No.: 10,312,939
Issued: Jun. 4, 2019
Appl. No.: 16/003,047
Filed: Jun. 7, 2018

U.S. Applications:
(60) Provisional application No. 62/522,044, filed on Jun. 19, 2017, provisional application No. 62/517,916, filed on Jun. 10, 2017.

(51) Int. Cl.
*H03M 13/00* (2006.01)
*H03M 13/11* (2006.01)
(Continued)

(52) U.S. Cl.
CPC .... *H03M 13/1168* (2013.01); *H03M 13/1137* (2013.01); *H03M 13/114* (2013.01);
(Continued)

(58) Field of Classification Search
CPC ... C23C 2/24; H03M 13/1137; H03M 13/114; H03M 13/1145; H03M 13/116;
(Continued)

(56) References Cited

U.S. PATENT DOCUMENTS 5,583,500 A 12/1996 Allen et al.
5,844,918 A 12/1998 Kato
(Continued)

FOREIGN PATENT DOCUMENTS

CN 1399829 A 2/2003
CN 1780199 A 5/2006
(Continued)

OTHER PUBLICATIONS

Sagar, G. Suresh Krishna & M.Sandeep Kumar, "A Layered Decoding Architecture for LDPC Decoder with Low Energy Consumption", Gates Institute of Technology, GiTAM university, Vizag, International Journal of Electronic Signals and Systems, ISSN: 2231-5969, vol. 3, Iss-1, 2013.*
(Continued)

*Primary Examiner* — Rachna S Desai
(74) *Attorney, Agent, or Firm* — QUALCOMM IP DEPT.; James Hunt Yancey, Jr.

(57) ABSTRACT

Certain aspects of the present disclosure provide low-density parity-check (LDPC) codes having pairwise orthogonality of adjacent rows, and a new decoder that exploits the pairwise row orthogonality for flexible decoder scheduling without performance loss. An apparatus includes a receiver configured to receive a codeword in accordance with a radio technology across a wireless channel via one or more antenna elements situated proximal the receiver. The apparatus includes at least one processor coupled with a memory and comprising decoder circuitry configured to decode the codeword based on a LDPC code to produce a set of information bits. The LDPC code is stored in the memory and defined by a base matrix having columns in which all adjacent rows are orthogonal in a last portion of the rows.

41 Claims, 15 Drawing Sheets

(51) Int. Cl.
*H04L 1/00* (2006.01)
*H04L 5/00* (2006.01)

(52) U.S. Cl.
CPC ..... *H03M 13/1145* (2013.01); *H03M 13/116* (2013.01); *H03M 13/1185* (2013.01); *H03M 13/616* (2013.01); *H03M 13/618* (2013.01); *H03M 13/6306* (2013.01); *H03M 13/6362* (2013.01); *H03M 13/6393* (2013.01); *H03M 13/6513* (2013.01); *H03M 13/6561* (2013.01); *H04L 1/0047* (2013.01); *H04L 1/0057* (2013.01); *H04L 1/0069* (2013.01); *H04L 5/0007* (2013.01)

(58) Field of Classification Search
CPC ..... H03M 13/1168; H03M 13/1185; H03M 13/616; H03M 13/618; H03M 13/6306; H03M 13/6362; H03M 13/6393; H03M 13/6513; H03M 13/6561; H04L 1/0047; H04L 1/0057; H04L 1/0069; H04L 5/0007; H04L 1/0007
See application file for complete search history.

(56) References Cited

U.S. PATENT DOCUMENTS 6,438,724 B1 8/2002 Cox et al.
6,633,865 B1 10/2003 Liao
6,674,768 B1 1/2004 Okamura
6,854,082 B1 2/2005 Rhee
6,931,581 B1 8/2005 Cassiday et al.
6,961,388 B2 11/2005 Ling et al.
6,961,888 B2 11/2005 Jin et al.
7,133,853 B2 11/2006 Richardson et al.
7,222,284 B2 5/2007 Stolpman
7,231,557 B2 6/2007 Jin et al.
7,237,171 B2 6/2007 Richardson
7,237,181 B2 6/2007 Richardson
7,493,551 B2 2/2009 Berens et al.
7,526,717 B2 4/2009 Kyung et al.
7,552,097 B2 6/2009 Richardson et al.
7,571,372 B1 8/2009 Burd et al.
7,581,159 B2 8/2009 Hocevar
7,627,801 B2 12/2009 Jin et al.
7,685,495 B2 3/2010 Bhushan
7,747,934 B2 6/2010 Livshitz
7,793,194 B2 9/2010 Seo et al.
7,840,880 B1 11/2010 Bain
7,979,784 B2 7/2011 Shao et al.
7,986,622 B2 7/2011 Frazier et al.
8,006,162 B2 8/2011 Choi et al.
8,117,516 B2 2/2012 Kim et al.
8,132,072 B2 3/2012 El-Khamy et al.
8,151,157 B2 4/2012 Lee et al.
8,261,155 B2 9/2012 Richardson et al.
8,271,846 B2 9/2012 Myung et al.
8,356,227 B2 1/2013 Chung et al.
8,392,789 B2 3/2013 Biscondi et al.
8,418,015 B2 4/2013 Cao et al.
8,453,030 B2 5/2013 Richardson et al.
8,473,821 B2 6/2013 Taghavi et al.
8,484,545 B2 7/2013 McLaughlin et al.
8,495,450 B2 7/2013 Abu-Surra et al.
8,495,459 B2 7/2013 Myung et al.
8,516,334 B2 8/2013 Xu et al.
8,578,249 B2 11/2013 Khandekar et al.
8,601,345 B1 12/2013 Huang
8,601,352 B1 * 12/2013 Anholt ..... H03M 13/618 714/790
8,650,457 B1 * 2/2014 Yeo ..... G06F 11/10 714/755
8,687,751 B1 4/2014 Lee et al.
8,751,902 B2 6/2014 Jin et al.
8,892,979 B2 11/2014 Richardson et al.
9,214,960 B2 * 12/2015 Jeong ..... H03M 13/618
9,325,347 B1 * 4/2016 Graumann ..... H04L 1/0053
9,362,956 B2 6/2016 Mahdavifar et al.
9,479,375 B1 10/2016 Ankarali et al.
9,602,133 B1 * 3/2017 Graumann ..... H03M 13/658
9,667,381 B2 5/2017 Jeong et al.
9,692,451 B2 6/2017 Vasista et al.
9,742,439 B1 * 8/2017 Graumann ..... H03M 13/114
9,774,893 B2 * 9/2017 Moon ..... H04N 21/4348
9,917,675 B2 3/2018 Kudekar et al.
10,051,333 B2 * 8/2018 Moon ..... H03M 13/118
10,075,266 B2 9/2018 Luo et al.
10,177,787 B1 1/2019 Danjean et al.
10,291,354 B2 5/2019 Richardson et al.
10,291,359 B2 5/2019 Xu et al.
10,312,939 B2 6/2019 Richardson et al.
10,313,057 B2 6/2019 Lin et al.
10,340,949 B2 7/2019 Soriaga et al.
10,348,451 B2 7/2019 Kudekar et al.
10,355,822 B2 7/2019 Patel et al.
10,454,499 B2 10/2019 Richardson et al.
10,469,104 B2 11/2019 Kudekar et al.
10,560,118 B2 2/2020 Soriaga et al.
10,644,836 B2 5/2020 Kudekar et al.
10,659,079 B2 5/2020 Hsu et al.
10,735,138 B2 8/2020 Kalachev et al.
10,784,901 B2 9/2020 Kudekar et al.
11,025,276 B2 6/2021 Richardson et al.
11,031,953 B2 6/2021 Richardson et al.
11,032,026 B2 6/2021 Richardson et al.
11,277,151 B2 3/2022 Soriaga et al.
2002/0147954 A1 10/2002 Shea
2003/0033575 A1 2/2003 Richardson et al.
2003/0053435 A1 3/2003 Sindhushayana et al.
2003/0123409 A1 7/2003 Kwak et al.
2003/0172342 A1 9/2003 Elzur
2004/0098659 A1 5/2004 Bjerke et al.
2004/0187129 A1 9/2004 Richardson
2004/0262376 A1 12/2004 Mezard et al.
2005/0050435 A1 3/2005 Kyung et al.
2005/0078765 A1 4/2005 Jeong et al.
2005/0149842 A1 7/2005 Kyung et al.
2005/0246617 A1 11/2005 Kyung et al.
2005/0283707 A1 12/2005 Sharon et al.
2005/0283708 A1 12/2005 Kyung et al.
2006/0020868 A1 1/2006 Richardson et al.
2006/0020872 A1 1/2006 Richardson et al.
2006/0026486 A1 2/2006 Richardson et al.
2006/0036925 A1 2/2006 Kyung et al.
2006/0156199 A1 7/2006 Palanki et al.
2006/0184855 A1 8/2006 Wang et al.
2006/0274687 A1 12/2006 Kim
2006/0294445 A1 12/2006 Divsalar et al.
2007/0011567 A1 1/2007 Choi et al.
2007/0011568 A1 * 1/2007 Hocevar ..... H03M 13/116 714/758
2007/0022362 A1 1/2007 Yue et al.
2007/0089025 A1 4/2007 Hong et al.
2007/0101243 A1 5/2007 Kim et al.
2007/0113147 A1 5/2007 Hong et al.
2007/0113148 A1 5/2007 Hong et al.
2007/0136636 A1 6/2007 Tsai et al.
2007/0162815 A1 7/2007 El-Khamy et al.
2008/0059862 A1 3/2008 Kyung et al.
2008/0062975 A1 3/2008 Mes et al.
2008/0109708 A1 5/2008 Kim et al.
2008/0126916 A1 5/2008 Chung et al.
2008/0178065 A1 7/2008 Khandekar et al.
2008/0204286 A1 8/2008 Kose
2008/0207120 A1 8/2008 Kurina et al.
2008/0298334 A1 12/2008 Arviv et al.
2008/0317152 A1 12/2008 Sun et al.
2008/0320353 A1 12/2008 Blankenship et al.
2009/0077456 A1 3/2009 Pi et al.
2009/0113256 A1 4/2009 Radosavljevic et al.
2009/0113276 A1 4/2009 Radosavljevic et al.
2009/0125735 A1 5/2009 Zimmerman
2009/0158129 A1 6/2009 Myung et al.
2009/0204868 A1 8/2009 Park et al.

(56) References Cited

U.S. PATENT DOCUMENTS

2009/0217129 A1 8/2009 Myung et al.
2009/0259915 A1 10/2009 Livshitz et al.
2009/0300461 A1 12/2009 Shor et al.
2010/0023834 A1 1/2010 Richardson et al.
2010/0077275 A1 3/2010 Yu et al.
2010/0107033 A1 4/2010 Kuri et al.
2010/0153812 A1 6/2010 Jin et al.
2010/0153819 A1 6/2010 Ueng et al.
2010/0185926 A1 7/2010 Lawson et al.
2010/0199153 A1 8/2010 Okamura et al.
2010/0211844 A1 8/2010 Yuda et al.
2010/0257425 A1 10/2010 Yue et al.
2010/0275089 A1 10/2010 Mow et al.
2010/0287438 A1 11/2010 Lakkis
2010/0325511 A1 12/2010 Oh et al.
2011/0047433 A1 2/2011 Abu-Surra et al.
2011/0066916 A1 3/2011 Abu-Surra et al.
2011/0096862 A1 4/2011 Kuri et al.
2011/0126072 A1 5/2011 Yoshimoto et al.
2011/0161772 A1 6/2011 Yoshii et al.
2011/0202820 A1 8/2011 Eroz et al.
2011/0239075 A1 9/2011 Xu et al.
2012/0084625 A1 4/2012 Pisek et al.
2012/0166917 A1 6/2012 El-Khamy et al.
2012/0240001 A1 9/2012 Abu-Surra et al.
2012/0317461 A1 12/2012 Hwang et al.
2013/0031438 A1 1/2013 Hu et al.
2013/0051556 A1 2/2013 Myung et al.
2013/0086445 A1 4/2013 Yedidia et al.
2013/0117344 A1 5/2013 Gross et al.
2013/0272378 A1 10/2013 Sole Rojals et al.
2014/0003533 A1 1/2014 He et al.
2014/0019820 A1 1/2014 Vardy et al.
2014/0040214 A1 2/2014 Ma et al.
2014/0068375 A1 3/2014 Eroz et al.
2014/0101116 A1 4/2014 Alnafoosi et al.
2014/0169388 A1 6/2014 Jeong et al.
2014/0173376 A1 6/2014 Jeong et al.
2014/0201592 A1 7/2014 Shen et al.
2014/0223254 A1 8/2014 Pisek
2014/0229788 A1 8/2014 Richardson
2014/0229789 A1 8/2014 Richardson
2014/0304574 A1 10/2014 Seo et al.
2014/0365842 A1 12/2014 Li et al.
2014/0365844 A1 12/2014 Kliger et al.
2014/0365845 A1 12/2014 Pantelias et al.
2015/0120798 A1 4/2015 Jeong et al.
2015/0178149 A1 6/2015 Cai et al.
2015/0188666 A1 7/2015 Mahdavifar et al.
2015/0229337 A1 8/2015 Alhussien et al.
2015/0249473 A1 9/2015 Li et al.
2015/0293716 A1 10/2015 Jiang et al.
2015/0334700 A1 11/2015 Tsai
2015/0381208 A1 12/2015 Li et al.
2016/0012465 A1 1/2016 Sharp
2016/0013810 A1 1/2016 Gross et al.
2016/0013931 A1 1/2016 Pisek et al.
2016/0020783 A1* 1/2016 Yang ..... H03M 13/1108
714/752
2016/0043745 A1 2/2016 Vojcic et al.
2016/0087648 A1 3/2016 Korb et al.
2016/0164537 A1 6/2016 Pisek et al.
2016/0164629 A1 6/2016 Ahn et al.
2016/0173132 A1 6/2016 Cho
2016/0183187 A1 6/2016 Park
2016/0197701 A1* 7/2016 Kim ..... H03M 13/1111
714/776
2016/0218750 A1 7/2016 Ma
2016/0309482 A1 10/2016 Verma et al.
2016/0337083 A1 11/2016 Englert et al.
2016/0380763 A1 12/2016 Ahn et al.
2017/0031599 A1 2/2017 Bowman et al.
2017/0047947 A1 2/2017 Hong et al.
2017/0063493 A1 3/2017 Mundhada et al.
2017/0075754 A1 3/2017 Wang
2017/0141798 A1 5/2017 Kudekar et al.
2017/0187489 A1 6/2017 Myung et al.
2017/0222663 A1 8/2017 Parthasarathy et al.
2017/0230149 A1 8/2017 Wang et al.
2017/0331494 A1 11/2017 Richardson et al.
2017/0331497 A1 11/2017 Richardson et al.
2017/0353267 A1 12/2017 Kudekar et al.
2017/0353269 A1 12/2017 Lin et al.
2017/0353271 A1 12/2017 Kudekar et al.
2017/0359086 A1 12/2017 Kudekar et al.
2017/0359148 A1 12/2017 Richardson et al.
2018/0007712 A1 1/2018 Lou et al.
2018/0034593 A1 2/2018 Xu et al.
2018/0152205 A1 5/2018 Kim et al.
2018/0205498 A1 7/2018 Kudekar et al.
2018/0226992 A1* 8/2018 Panteleev ..... H03M 13/005
2018/0358984 A1 12/2018 Richardson et al.
2018/0367245 A1 12/2018 Soriaga et al.
2018/0367253 A1 12/2018 Nammi et al.
2019/0013900 A1 1/2019 Patel
2019/0052400 A1 2/2019 Soriaga et al.
2019/0068318 A1 2/2019 Marinier et al.
2019/0199475 A1 6/2019 Richardson et al.
2019/0245654 A1 8/2019 Richardson et al.
2019/0260507 A1 8/2019 Lin et al.
2019/0280817 A1 9/2019 Kudekar et al.
2019/0356337 A1 11/2019 Richardson et al.
2019/0394000 A1 12/2019 Kim et al.
2020/0028523 A1 1/2020 Li et al.
2020/0044665 A1 2/2020 Zheng et al.
2020/0052817 A1 2/2020 Kudekar et al.
2020/0059317 A1 2/2020 Patel et al.
2020/0067641 A1 2/2020 Ma et al.
2020/0162109 A1 5/2020 Zhang et al.
2020/0235759 A1 7/2020 Ye et al.
2020/0235854 A1 7/2020 Xu et al.
2020/0322085 A1 10/2020 Kudekar et al.
2020/0404069 A1 12/2020 Li et al.
2020/0412387 A1 12/2020 Kudekar et al.
2021/0058192 A1 2/2021 Richardson et al.
2021/0281359 A1 9/2021 Xu
2022/0224356 A1 7/2022 Kudekar et al.
2023/0275599 A1 8/2023 Richardson et al.
2023/0327683 A1 10/2023 Kudekar et al.

FOREIGN PATENT DOCUMENTS

CN 1868145 A 11/2006
CN 1953335 A 4/2007
CN 1960188 A 5/2007
CN 101005301 A 7/2007
CN 101019328 A 8/2007
CN 101047387 A 10/2007
CN 101076946 A 11/2007
CN 101141133 A 3/2008
CN 101188428 A 5/2008
CN 101217337 A 7/2008
CN 101601187 A 12/2009
CN 101645763 A 2/2010
CN 101682381 A 3/2010
CN 101826878 A 9/2010
CN 102017426 A 4/2011
CN 102340378 A 2/2012
CN 102437858 A 5/2012
CN 102474386 A 5/2012
CN 102571105 A 7/2012
CN 102651652 A 8/2012
CN 102783206 A 11/2012
CN 103152056 A 6/2013
CN 103188044 A 7/2013
CN 103281166 A 9/2013
CN 103441816 A 12/2013
CN 103636130 A 3/2014
CN 103716130 A 4/2014
CN 103746708 A 4/2014
CN 103780329 A 5/2014
CN 103905152 A 7/2014

(56) References Cited

FOREIGN PATENT DOCUMENTS

| | | | |
|---|---|---|---|
| CN | 104202126 | A | 12/2014 |
| CN | 105227189 | A | 1/2016 |
| CN | 105284053 | A | 1/2016 |
| CN | 105306165 | A | 2/2016 |
| CN | 105337696 | A | 2/2016 |
| CN | 106341138 | A | 1/2017 |
| CN | 107733442 | A | 2/2018 |
| CN | 109150191 | A | 1/2019 |
| EP | 1601109 | A2 | 11/2005 |
| EP | 1724932 | A1 | 11/2006 |
| EP | 2091171 | A2 | 8/2009 |
| EP | 2096760 | A1 | 9/2009 |
| EP | 2518923 | A1 | 10/2012 |
| EP | 2899912 | A1 | 7/2015 |
| EP | 3046259 | A1 | 7/2016 |
| EP | 3264611 | A1 | 1/2018 |
| EP | 3622627 | | 3/2020 |
| IN | 104981978 | A | 10/2015 |
| JP | H07288479 | A | 10/1995 |
| JP | 2007507156 | A | 3/2007 |
| JP | 2009081577 | A | 4/2009 |
| JP | 2010508728 | A | 3/2010 |
| JP | 2010517444 | A | 5/2010 |
| JP | 2010537460 | A | 12/2010 |
| JP | 2011512106 | A | 4/2011 |
| JP | 2011514049 | A | 4/2011 |
| JP | 2012142968 | A | 7/2012 |
| JP | 2016507200 | A | 3/2016 |
| JP | 2016518035 | A | 6/2016 |
| JP | 2016539534 | A | 12/2016 |
| KR | 100833515 | B1 | 5/2008 |
| KR | 20090092197 | A | 8/2009 |
| KR | 20090130176 | A | 12/2009 |
| KR | 20110106438 | A | 9/2011 |
| KR | 101157246 | B1 | 6/2012 |
| KR | 20150034561 | A | 4/2015 |
| KR | 101524869 | B1 | 6/2015 |
| KR | 20150118992 | A | 10/2015 |
| KR | 101598754 | B1 | 3/2016 |
| KR | 20170053589 | A | 5/2017 |
| NO | 2015054268 | A1 | 4/2015 |
| RU | 2426241 | | 8/2011 |
| RU | 2520405 | C2 | 6/2014 |
| RU | 2520406 | C2 | 6/2014 |
| RU | 2718171 | C1 | 3/2020 |
| SG | 11201905916 | S | 8/2019 |
| TW | 427076 | B | 3/2001 |
| TW | I272777 | B | 2/2007 |
| TW | 200711359 | A | 3/2007 |
| TW | 201334425 | A | 8/2013 |
| WO | 2002062002 | A1 | 8/2002 |
| WO | 2006124428 | A2 | 11/2006 |
| WO | 2008052202 | A1 | 5/2008 |
| WO | 2008092040 | A2 | 7/2008 |
| WO | 2008112625 | A1 | 9/2008 |
| WO | 2009005264 | A1 | 1/2009 |
| WO | 2009011134 | A1 | 1/2009 |
| WO | 2009107990 | A2 | 9/2009 |
| WO | 2012064869 | A1 | 5/2012 |
| WO | 2014117836 | A1 | 8/2014 |
| WO | 2014127129 | A1 | 8/2014 |
| WO | 2014127140 | A1 | 8/2014 |
| WO | 2015139297 | A1 | 9/2015 |
| WO | 2017091244 | A1 | 6/2017 |
| WO | 2017092693 | A1 | 6/2017 |
| WO | 2017197267 | | 11/2017 |
| WO | 2017209837 | A1 | 12/2017 |
| WO | 2018029633 | A1 | 2/2018 |
| WO | 2018030927 | A1 | 2/2018 |
| WO | 2018050062 | A1 | 3/2018 |
| WO | 2018128560 | A1 | 7/2018 |
| WO | 2018144251 | A1 | 8/2018 |
| WO | 2018144560 | A1 | 8/2018 |

OTHER PUBLICATIONS

Mahdavifar H., et al., "Fast Multi-dimensional Polar Encoding and Decoding," Information Theory and Applications Workshop (ITA), IEEE, 2014, 5 pages.

Myung S., et al., "Lifting Methods for Quasi-Cyclic LDPC Codes", IEEE Communications Letters, IEEE Service Center, Piscataway, NJ, US, (Jun. 1, 2006) Jun. 2006, vol. 10, No. 6, pp. 489-491, doi:10.1109/LCOMM.2006.1638625, ISSN 1089-7798.

Partial International Search Report—PCT/US2017/025421—ISA/EPO—dated Jul. 10, 2017.

Partial International Search Report—PCT/US2018/038229—ISA/EPO—dated Oct. 11, 2018.

Qualcomm Incorporated: "LDPC Codes—HARQ, Rate", 3GPP TSG-RAN WG1 #84b, 3GPP Draft; R1-162209 LDPC_Ratecompatibility_Highleveldesign, 3rd Generation Partnership Project (3GPP), Mobile Competence Centre, 650, Route Des Lucioles; F-06921 Sophia-Antipolis Cedex; France, vol. RAN WG1, No. Busan, Korea; Apr. 11, 2016-Apr. 15, 2016, Apr. 2, 2016, 4 Pages, XP051080037, Retrieved from the Internet: URL: http://www.3gpp.org/ftp/tsg_ran/WG1_RL1/TSGR1_84b/Docs/, pp. 2, 3.

Qualcomm Incorporated: "LDPC Rate Compatible Design Overview", 3GPP Draft, 3GPP TSG-RAN WG1#86bis, R1-1610137_LDPC_RATE_COMPATIBLE_DESIGN, 3rd Generation Partnership Project (3GPP), Mobile Competence Centre, 650, Route Des Lucioles, F-06921, Sophia-Antipolis Cedex, France, vol. RAN WG1. No. Lisbon, Portugal, Oct. 10, 2016-Oct. 14, 2016, Oct. 9, 2016, 27 Pages, XP051150160, Retrieved from the Internet: URL: http://www.3gpp.org/ftp/Meetings_3GPP_SYNC/RAN1/Docs/ [retrieved on Oct. 9, 2016], p. 1-p. 9.

Qualcomm Incorporated: "LDPC Segmentation", 3GPP Draft; R1-1711211, 3GPP TSG-RAN WG1#89ah,LDPC Segmentation, 3rd Generation Partnership Project (3GPP), Mobile Competence Centre, 650, Route Des Lucioles, F-06921, Sophia-Antipolis Cedex, France, vol. RAN WG1, No. Qingdao, China; Jun. 27, 2017-Jun. 30, 2017, Jun. 26, 2017 (Jun. 26, 2017), XP051300410, pp. 1-6, Retrieved from the Internet: URL: http://www.3gpp.org/ftp/Meetings_3GPP_SYNC/RAN1/Docs/ [retrieved on Jun. 26, 2017], Sections 1, 3-4.

Samsung: "Flexibility of LDPC—Length, Rate and IR-HARQ", 3GPP Draft, 3GPP TSG RAN WG1 #85, R1-164007 3rd Generation Partnership Project (3GPP), Mobile Competence Centre, 650, Route Des Lucioles, F-06921 Sophia-Antipolis Cedex, France, vol. RAN WG1. No. Nanjing, China, May 23, 2016-May 27, 2016 May 14, 2016 (May 14, 2016), XP051090116, 8 Pages, Retrieved from the Internet: URL:http://www.3gpp.org/ftp/tsg_ran/WG1_RL1/TSGR1_85/Docs/ [retrieved on May 14, 2016], p. 1-p. 3 p. 6.

Samsung: "Preliminary Evaluation Results on New Channel Coding Scheme for NR—LDPC Code for High Throughput", 3GPP TSG-RAN WG1#85, R1-164812, May 14, 2016, 17 Pages.

Shea J M, et al., "Multidimensional Codes", In Wiley Encyclopedia of Telecommunications, vol. 3, pp. 1-26, XP055402230, https://doi.org/10.1002/0471219282.eot342, Apr. 15, 2003, Entirety.

Stolte N., Rekursive Codes mit der Plotkin-Konstruktion und ihre Decodierung, D17 Darmstadter Dissertation, Jan. 1, 2002, 151 pages, (in particular, pp. 13-30), XP055241445, URL:http://tuprints.ulb.tu-darmstadt.de/epda/000183/stolte.pdf, Techn. Universitat, Diss., 2002 (Nicht f. d. Austausch)_Darmstadt [retrieved on Jan. 14, 2016].

Tal I., et al., "List Decoding of Polar Codes", International Symposium on Information Theory proceedings, ISIT 2011, St. Petersburg, Russia, Jul. 31 -Aug. 5, 2011, May 31, 2012 (May 31, 2012), pp. 1-11, XP055225954, Piscataway, NJ, ISBN: 978-1-4577-0596-0, Retrieved from the Internet: URL: http://arxiv.org/pdf/1206.0050.pdf [retrieved on Nov. 4, 2015] sections II-III.

Trifonov P., "Efficient Design and Decoding of Polar Codes", IEEE Transactions on Communications, IEEE Service Center, Piscataway, NJ, USA, vol. 60, No. 11, Nov. 1, 2012 (Nov. 1, 2012), XP011473857, pp. 3221-3227, ISSN: 0090-6778, DOI: 10.1109/TCOMM.2012.081512.110872.

Written Opinion of the International Preliminary Examining Authority dated May 14, 2018—PCT/US2017/035026.

(56) References Cited

OTHER PUBLICATIONS

Zhou H., et al., "Segmented CRC-Aided SC List Polar Decoding", 2016 IEEE 83rd Vehicular Technology Conference (VTC Spring), May 15, 2016 (May 15, 2016), XP032918751, pp. 1-5, DOI: 10.1109/VTCSPRING.2016.7504469, [retrieved on Jul. 5, 2016], Abstract, Sections III.
ZTE: "NR LDPC Design", 3GPP TSG RAN WG1 Meeting #89, 3GPP Draft; R1-1709289, NR LDPC Design, 3rd Generation Partnership Project (3GPP), Mobile Competence Centre; 650, Route Des Lucioles; F-06921, Sophia-Antipolis Cedex; France, vol. RAN WG1, No. Hangzhou, China; May 15, 2017-May 19, 2017, May 16, 2017 (May 16, 2017), XP051285041, pp. 1-12, Retrieved from the Internet: URL: http://www.3gpp.org/ftp/tsg_ran/WG1_RL1/TSGR1_89/Docs/ [retrieved on May 16, 2017] the whole document.
ZTE: "Structured LDPC Coding with Rate Matching", 3GPP TSG RAN WG1 LTE Ad Hoc Meeting, 3GPP Draft; R1-060115 Structured LDPC Coding with Rate Matching, 3rd Generation Partnership Project (3GPP), Mobile Competence Centre; 650, Route Des Lucioles; F-06921 Sophia-Antipolis Cedex; France, vol. Ran WG1, No. Helsinki, Finland; Jan. 23, 2006-Jan. 25, 2006, Jan. 19, 2006, 13 Pages, XP050950962, Retrieved from the Internet: URL: http://www.3gpp.org/ftp/tsg_ran/WG1_RL1/TSGR1_AH/LTE_AH_0601/Docs/, [retrieved on Jan. 19, 2006] p. 7.
"3rd Generation Partnership Project; Technical Specification Group Radio Access Network; NR; Multiplexing and Channel Coding (Release 15)", 3GPP TS 38.212 V15.3.0 (Sep. 2018), pp. 1-95.
Ericsson: "CRC Attachment Point for MAC-is When Transmitting MAC-c PDU", R2-086458, 3GPP TSG-RAN WG2 Meeting #64 , Prague, Czech Republic, Nov. 10-Nov. 14, 2008, Nov. 3, 2008, 2 Pages.
Ericsson: "LDPC Code Performance for High Reliability Use Cases", 3GPP Draft, 3GPP TSG RAN WG1 NR Ad-Hoc#2, R1-1710499 LDPC Code Performance for High Reliability Use Cases, 3rd Generation Partnership Project (3GPP), Mobile Competence Centre, 650, Route Des Lucioles, F-06921 Sophia-Antipolis CE, vol. RAN WG1, No. Qingdao, P.R. China, Jun. 27, 2017-Jun. 30, 2017, Jun. 26, 2017 (Jun. 26, 2017), XP051299707, pp. 1-6, Retrieved from the Internet: URL: http://www.3gpp.org/ftp/Meetings_3GPP_SYNC/RAN1/Docs/.
Intel Corporation: "LDPC Code Design for NR", 3GPP TSG RAN WG1 Meeting #85, 3GPP Draft; R1-164183, 3rd Generation Partnership Project (3GPP), Mobile Competence Centre; 650, Route Des Lucioles; F-06921 Sophia-Antipolis Cedex; France, vol. Ran WG1, No. Nanjing, China; May 23, 2016-May 27, 2016, May 14, 2016 (May 14, 2016), 4 Pages, XP051090075, Retrieved from the Internet: URL: http://www.3gpp.org/ftp/tsg_ran/WG1_RL1/TSGR1_85/Docs/ [retrieved on May 14, 2016] p. 1-p. 3.
Intel Corporation: "LDPC Coding Chain" [online], 3GPP Draft, 3GPP TSG RAN WG1 Meeting NR-Adhoc#2, R1-1711344, 3rd Generation Partnership Project (3GPP), Mobile Competence Centre, 650, Route Des Lucioles, F-06921 Sophia-Antipolis Cedex, France, vol. Ran WG1, No. Qingdao, P.R. China, Jun. 27, 2017-Jun. 30, 2017, Jun. 20, 2017 (Jun. 20, 2017), XP051305812, pp. 1-6, Retrieved from the Internet: URL: http://www.3gpp.org/ftp/tsg_ran/WG1_RL1/TSGR1_AH/NR_AH_1706/Docs/.
Mediatek Inc: "Resolving Polar Code Memory Complexity Issue", 3GPP TSG RAN WG1 Meeting #86bis, R1-1610420, Lisbon, Portugal, Oct. 10, 2016-Oct. 14, 2016, 6 Pages, Oct. 18, 2016, Internet URL: http://www.3gpp.org/ftp/tsg_ran/WG1_RL1/TSGR1_86b/Docs/R1-1610420.zip.
Nokia, et al., "Alcatel-Lucent Shanghai Bell Performance and Complexity of Turbo, LDPC and Polar Codes", 3GPP TSG-RAN WG1 #84bis, R1-162897, Busan, Korea, Apr. 11-15, 2016, 6 Pages.
Nokia: "Rate Matching for LDPC" [online], 3GPP TSG RAN WG1 NR Ad-Hoc#2, R1-1711536, Jun. 19, 2017, 5 Pages, Internet URL: http://www.3gpp.org/ftp/tsg_ran/WG1_RL1/TSGR1_AH/NR_AH_1706/Docs/R1-1711536.zip. (In particular, refer to Section 2).
Qualcomm Incorporated: "LDPC Design Overview", 3GPP TSG-RAN WG1#85, R1-164697, May 2016, pp. 1-5, May 23, 2016-May 27, 2016, URL: http://www.3gpp.org/ftp/tsg_ran/WG1_RL1/TSGR1_812/Docs/R1-164697.zip.
Qualcomm Incorporated: "LDPC Rate Compatible Design" [online], 3GPP TSG-RAN WG1 #89, R1-1709181, May 13, 2017, pp. 1-11, Retrieved from the Internet: URL:http://www.3gpp.org/ftp/tsg_ran/WG1_RL1/TSGR1_89/Docs/R1-1709181.zip. (In particular, refer to Section 1).
Qualcomm Incorporated: "Polar Code Design Overview", 3GPP Draft, 3GPP TSG-RAN WG1 #85, R1-164699_POLAR_DESIGN_OVERVIEW, 3rd Generation Partnership Project (3GPP), Mobile Competence Centre, 650, Route Des Lucioles, F-06921 Sophia-Antipolis Cedex, France, vol. RAN WG1, No. Nanjing, China, May 23, 2016-May 27, 2016, May 14, 2016 (May 14, 2016), XP051089936, 3 Pages, Retrieved from the Internet: URL: http://www.3gpp.org/ftp/tsg_ran/WG1_RL1/TSGR1_85/Docs/.
Richardson T., et al., "LDPC Proposal Update", C30-20061218-004, 3GPP2-Drafts, Dec. 18, 2006 (Dec. 18, 2006), pp. 1-30, XP040476671, ftp://ftp.3gpp2.org/TSGC/Working/2007/2007-01-Vancouver/TSG-C-2007-01-Vancouver/WG3/Distribution%202006.12.18/C30-20061218-004_QCOM_LDPC_proposal_update.pdf.
Shi L., "Research on Polar Code Characters and its Encoding and Decoding Method", Chinese Master's Theses Full-Text Database, Information Science and Technology, Issue No. 12, Dec. 15, 2015.
ZTE, et al., "Compact LDPC Design for eMBB", 3GPP Draft, 3GPP TSG RAN WG1 AH NR Meeting, R1-1700247 Compact LDPC Design for EMBB_Final, 3rd Generation Partnership Project (3GPP), Mobile Competence Centre, 650, Route Des Lucioles, F-06921 Sophia-Antipolis Cedex, France, vol. RAN WG1. No. Spokane, USA, Jan. 16, 2017-Jan. 20, 2017 Jan. 10, 2017 (Jan. 10, 2017), XP051202750, pp. 1-16, Retrieved from the Internet: URL:http://www.3gpp.org/ftp/tsg_ran/WG1_RL1/TSGR1_AH/NR_AH_1701/Docs/ [retrieved on-Jan. 10, 2017] p. 1-p. 13.
Communication pursuant to Article 94(3) EPC, dated by the European Patent Office dated Oct. 12, 2021 for EPO Application No. 18735108.5, 6 Pages.
Communication pursuant to Rule 164(2)(b) and Article 94(3) EPC, dated by the European Patent Office dated Oct. 15, 2021 for EPO Application No. 17729655.5, 15 Pages.
Examination report under sections 12 & 13 of the Patents Act, 1970 and the Patents Rules, 2003, dated by Intellectual Property India dated Nov. 8, 2021 for Application No. 2018/47039985, 6 pages.
Stolte N., "Recursive Codes with the Plotkin-Construction and Their Decoding," (DOI:10.13140/RG.2.1.1036.6803) https://www.researchgate.net/publication/286929473_Recursive_Codes_with_the_Plotkin-Construction_and_Their_Decoding , May 2003, (Jan. 31, 2001), the whole document, 145 pages.
Oh M., et al., "LDPC Coding for OFDMA PHY", IEEE C802.16e-04/487r3, IEEE Internet http://grouper.ieee.org/, Nov. 2004, (Nov. 9, 2004), pp. 0-9.
Kalsi A., et al., "A Base Matrix Method to Construct Column Weight 3 Quasi-Cyclic LDPC Codes with High Girth", IEEE, 4 Pages, Sep. 8, 2016.
Shuyang L., et al., "Design of High Efficient LDPC Encoder in IEEE 802.16e", 4 Pages, Nov. 2, 2012.
International Preliminary Report on Patentability—PCT/CN2016/091914, The International Bureau of WIPO—Geneva, Switzerland, dated Feb. 7, 2019.
International Preliminary Report on Patentability—PCT/US2016/048178, The International Bureau of WIPO—Geneva, Switzerland, dated May 24, 2018.
International Preliminary Report on Patentability—PCT/US2017/025421, The International Bureau of WIPO—Geneva, Switzerland, dated May 18, 2018.
International Preliminary Report on Patentability—PCT/US2017/032156, The International Bureau of WIPO—Geneva, Switzerland, dated Jul. 24, 2018.
International Preliminary Report on Patentability—PCT/US2017/032413, The International Bureau of WIPO—Geneva, Switzerland, dated Aug. 24, 2018.

(56) References Cited

OTHER PUBLICATIONS

International Preliminary Report on Patentability—PCT/US2017/037465, The International Bureau of WIPO—Geneva, Switzerland, dated Sep. 25, 2018.
International Preliminary Report on Patentability—PCT/US2017/037468, The International Bureau of WIPO—Geneva, Switzerland, dated Sep. 10, 2018.
International Preliminary Report on Patentability, PCT/US2017/035026, dated Aug. 14, 2018.
International Search Report and Writien Opinion, PCT/US2017/025421, dated Mar. 31, 2017, International Search Authority—European Patent Office, Nov. 7, 2017, pp. 1-33.
International Search Report and Written Opinion—PCT/CN2016/091914—ISA/EPO—dated Apr. 17, 2017.
International Search Report and Written Opinion—PCT/CN2017/077868—ISA/EPO—dated Jun. 2, 2017.
International Search Report and Written Opinion—PCT/US2016/048178—ISA/EPO—dated Nov. 3, 2016.
International Search Report and Written Opinion—PCT/US2017/025422—ISA/EPO—dated Oct. 10, 2017.
International Search Report and Written Opinion—PCT/US2017/032413—ISA/EPO—dated Aug. 30, 2017.
International Search Report and Written Opinion—PCT/US2017/035026—ISA/EPO—dated Nov. 6, 2017.
International Search Report and Written Opinion—PCT/US2017/037465—ISA/EPO—dated Sep. 27, 2017.
International Search Report and Written Opinion—PCT/US2017/037468—ISA/EPO—dated Sep. 22, 2017.
International Search Report and Written Opinion—PCT/US2018/038229—ISA/EPO—dated Nov. 29, 2018.
International Search Report and Written Opinion—PCT/US2017/032156—ISA/EPO—dated Aug. 14, 2017.
Jiang M., et al., "An Improved Variable Length Coding Scheme Using Structured LDPC Codes", Wireless Communications and Signal Processing (WCSP), 2010 International Conference on, IEEE, Piscataway, NJ, USA, Oct. 21, 2010 (Oct. 21, 2010), XP031800170, pp. 1-5, ISBN: 978-1-4244-7556-8, p. 1, right-hand column—p. 4, left-hand column.
Alcatel-Lucent et al., "LDPC Coding Proposal for LBC", 3GPP2 Draft; C30-20070226-002_C30-20070212-034R1_AHLQRZ_LDPC_PROPOSAL_FOR_LBC, Mar. 27, 2007, XP062206073, Retrieved from the Internet: URL:http://ftp.3gpp2.org/TSGC/Working/2007/2007-03-Atlanta/TSG-C-2007-03-Atlanta/WG3/LDPC Ad Hoc Call,2007.02.26/ pp. 1-27.
Alcatel-Lucent et al., "LDPC Coding Proposal for LBC", 3GPP2-Drafts, 2500 Wilson Boulevard, Suite 300, Arlington, Virginia 22201, USA, Mar. 15, 2007 (Mar. 15, 2007), XP040477608, 32 Pages, page 1-p. 13, pp. 10-12.
Arikan E., "Channel Polarization: a Method for Constructing Capacity-Achieving Codes for Symmetric Binary-Input Memoryless Channels", IEEE Transactions on Information Theory, IEEE Press, USA, vol. 55, No. 7, Jul. 1, 2009 (Jul. 1, 2009), pp. 3051-3073, XP080428257, ISSN: 0018-9448.
Chapter II Demand and Amendment under PCT Article 34 dated Jan. 18, 2018, PCT/US2017/035026.
Chen B., et al., "List Viterbi Algorithms for Continuous Transmission", IEEE Transactions on Communications, IEEE Service Center, Piscataway, NJ, USA, vol. 49, No. 5, XP011009921, May 1, 2001 (May 1, 2001), pp. 784-792, ISSN: 0990-6778.
El-Khamy M., et al., "Binary Polar Codes are Optimized Codes for Bitwise Multistage Decoding", Computer Science, Information Theory, Arxiv.org, Cornell University Library, 201 Olin Library Cornell University Ithaca, NY 14853, Apr. 12, 2016, XP080695103, DOI: 10.1049/EL.2016.0837, 2 pages.
Ericsson: "Design Parameters and Implementation Aspects of LPDC Codes," 3GPP Draft, 3GPP TSG-RAN WG1 #88, R1-1703537 Design Parameters and Implementation Aspects of LDPC Codes, 3rd Generation Partnership Project (3GPP), Mobile Competence Centre; 650, Route Des Lucioles; F-06921 Sophia-Antipolis, vol. RAN WG1, No. Athens, Greece; Feb. 13, 2017-Feb. 17, 2017, Feb. 15, 2017, XP051222070, 10 pages, Retrieved from the Internet: URL: http://www.3gpp.org/ftp/tsg_ran/WG1_RL1/TSGR1_88/Docs/.
Ericsson: "Implementation and Performance of LDPC Decoder", 3GPP TSG RAN WG1 AH_NR Meeting R1-1700111, Jan. 20, 2017, 8 Pages.
Ericsson: "Performance and Complexity of Per-Segment CRC Attachment Methods", 3GPP TSG-RAN WG1#50, 3GPP Draft, R1-073741, 3rd Generation Partnership Project (3GPP), Mobile Competence Centre, 650, Route Des Lucioles, F-06921, Sophia-Antipolis Cedex, France, vol. RAN WG1, No. Athens, Greece; Aug. 15, 2007 (Aug. 15, 2007), XP050107330, 3 Pages.
Ericsson: "System Information for Low Complexity and Extended Coverage", 3GPP Draft; R1-1708730—Sysinfo for Low Complexity and Ext Coverage, 3rd Generation Partnership Project (3GPP), Mobile Competence Centre; 650, Route Des Lucioles; F-06921 Sophia-Antipolis Cedex; France, vol. RAN WG1, No. Hangzhou, China; May 15, 2017-May 19, 2017 May 7, 2017, XP051263297, Retrieved from the Internet: URL:http://www.3gpp.org/ftp/tsg_ran/WG1_RL1/TSGR1_89/Docs/.
Guo J., et al., "Multi-CRC Polar Codes and Their Applications", IEEE Communications Letters, IEEE Service Center, Piscataway, NJ, US, vol. 20, No. 2, Feb. 1, 2016 (Feb. 1, 2016), XP011598246, pp. 212-215, ISSN: 1089-7798, DOI:10.1109/LCOMM.2015.2508022, [retrieved on Feb. 8, 2016], Abstract, Sections II, III, IV.
Huawei et al., "Details of the Polar Code Design", 3GPP TSG RAN WG1 Meeting #87, R1-1611254, Reno, USA, 3rd Generation, Partnership Project (3GPP), Mobile Competence Centre; 650, Route Des Lucioles; F-06921 Sophia-Antipolis Cedex; France, vol. RAN WG1, No. Reno, USA; Nov. 10, 2016-Nov. 14, 2016, Nov. 13, 2016 (Nov. 13, 2016), XP051175235, Retrieved from the Internet: URL: http://www.3gpp.org/ftp/Meetings_3GPP_SYNC/RAN1/Docs Nov. 10-14, 2016, 15 pages.
IEEE Standard for Local and Metropolitan Area Networks Part 16: Air Interface for Broadband Wireless Access Systems; IEEE Std 802.16-2009 (Revision of IEEE Std 802.16-2004), IEEE Standard, IEEE, Piscataway, NJ, USA, May 29, 2009, XP068045637, ISBN: 978-0-7381-5919-5, pp. 1-2080, p. 1057-p. 1061.
Interdigital Inc: "Code Block Segmentation for Data Channel", 3GPP Draft; R1-1710958, Code Block Segmentation for Data Channel, 3rd Generation Partnership Project (3GPP), Mobile Competence Centre; 650 Route Des Lucioles; F-06921, Sophia-Antipolis Cedex; France, vol. RAN WG1, no. Qingdao; Jun. 27, 2017-Jun. 30, 2017, Jun. 26, 2017 (Jun. 26, 2017), XP051300159, Retrieved from the Internet: URL: http://www.3gpp.org/ftp/Meetings_3GPP_SYNC/RAN1/Docs/.
International Preliminary Report on Patentability—PCT/US2018/038229, The International Bureau of WIPO—Geneva, Switzerland, dated Jan. 2, 2020.
Hashemi S.A., et al., "Partitioned Successive-Cancellation List Decoding of Polar Codes", 2016 IEEE International Conference on Acoustics. Speech and Signal Processing (ICASSP), Mar. 20, 2016, pp. 957-960, https://ieeexplore.eee.org/stamp/stamp.jsp?tp=&arnumber=7471817, XP032900743, DOI: 10.1109/ICASSP.2016.7471817, [retrieved on May 18, 2016].
3GPP, "Technical Specification Group Radio Access Network, Study on New Radio Access Technology", 3GPP TR 38.912 V14.0.0., Release 14, 650 Route Des Lucioles, Sophia-Antipolis, Valbonne, France; https://portal.3gpp.org/desktopmodules/Specifications/SpecificationDetails.aspx?specificationId=3059. (Mar. 2017).
Decision of Rejection issued in corresponding Japanese Patent Application No. 2019-567304, dated Dec. 21, 2020 (9 pages).
Li, B., et al., "An Adaptive Successive Cancellation List Decoder for Polar Codes with Cyclic Redundancy Check", IEEE Communications Letters, IEEE Service Center, Piscataway, NJ, US, vol. 16, No. 12, Dec. 1, 2012 (Dec. 1, 2012), XP011478817, pp. 2044-2047, ISSN: 1089-7798, DOI:10.1109/LCOMM.2012.111612.121898, abstract, Section I, III and IV.
Nokia, et al., "LDPC Design for eMBB Data", 3GPP Draft, 3GPP TSG-RAN WG1#NR Ad-Hoc meeting, R1-1701028_LDPC Design for EMBB, 3rd Generation Partnership Project (3GPP), Mobile Competence Centre; 650, Route Des Lucioles; F-06921 Sophia-Antipolis Cedex; France, vol. RAN WG1, no. Spokane, U.S.A., Jan.

(56) References Cited

OTHER PUBLICATIONS 16, 2017-Jan. 20, 2017, Jan. 16, 2017 (Jan. 16, 2017), 13 Pages, XP051208543, Retrieved from the Internet: URL: http://www.3gpp.org/ftp/Meetings_3GPP_SYNC/RAN1/Docs/ [retrieved on Jan. 16, 2017], the whole document.
Nokia, et al., "R1-1701028_PCM_Large_Blocks," Jan. 9, 2017 (Jan. 9, 2017), pp. 1-1, XP055847852, Retrieved from the Internet: URL: https://www.3gpp.org/ftp/tsg_ran/WG1_RL1/TSGR1_AH/NR_AH_1701/Docs/ [retrieved on Oct. 5, 2021].
Yu Q., et al., "Hybrid Parity-Check and CRC Aided SCL Decoding for Polar Codes", 2016 IEEE International Conference on Internet of Things (iThings) and IEEE Green Computing and Communications (GreenCom) and IEEE Cyber, Physical and Social Computing (CPScom) and IEEE Smart Data (SmartData), IEEE, Dec. 15, 2016 (Dec. 15, 2016), XP033093024, Dec. 18, 2016, pp. 711-716, DOI: 10.1109/IThings-Greencom-Cpscom-Smartdata.2016.152 [retrieved on May 1, 2017] section III-A, figure 3.
Notice of Reasons for Rejection for Japan Patent Application No. 2021-070978 dated Dec. 5, 2022, 10 pages.
IEEE Std 802.16e-2005, "Air Interface For Fixed and Mobile Broadband Wireless Access Systems", Amendment 2 and Corrigendum 1 to IEEE Std 802.16-2004, IEEE, Feb. 28, 2006, pp. 626-630, ( https://www.worldcat.org/title/ieee-standardfor-local-and-metropolitan-area-networks-part-16-air-interface-for-fixed-and-mobilebroadband-wireless-access-systems-amendment-2-physical-and-medium-accesscontrol-layers-for-combined-fixed-and-mobile-operation-in-licensed-bands-andcorrigendum-1/oclc/6455369). XP002515198.
Jacobsen, N., et al., "Design of Rate-Compatible Irregular LDPC Codes Based on Edge Growth and Parity Splitting", 2007 IEEE 66th Vehicular Technology Conference, Oct. 15, 2007, pp. 1052-1056, DOI: 10.1109/ VETECF.2007.228.
Keeth, J., (Nokia): 3GPP TSG-RAN WG1 Email (Subject: "[89-24] LDPC Code Base Graph # 1 for NR", Date: Tue, May 23, 2017 09:33:58 +0000), May 23, 2017, 1 Page, Retrieved from the Internet: URL: https://list.etsi.org/scripts/wa.exe?A2=ind1705D&L=3GPP_TSG_RAN_WG1&P=R18940&u=75177.
Keeth, J., (Nokia): 3GPP TSG-RAN WG1 Email (Subject: "Re: [89-24] LDPC Code Base Graph # 1 for NR", Date: Wed, Jun. 7, 2017 18:17:47 +0000), and The Attachment "Way forward on LDPC designs_clean.docx", Jun. 7, 2017, 58 Pages, Retrieved from the Internet: URL: https://list.etsi.org/scripts/wa.exe?A2=ind1706A&L=3GPP_TSG_RAN_WG1&P=R3822731.
Ma, F., "Puncturing Schemes for Rate-Compatible LDPC Codes", Chinese Selected Doctoral Dissertations and Master's Theses Full-Text Databases (Master) Information Science and Technology, Oct. 15, 2012 (Dec. 2011), 60 Pages.
Mediatek Inc: "A Multi-Codebook Embedded Compact QC-LDPC Design" [online], 3GPP Draft, 3GPP TSG-RAN WG1 NR, Spokane, USA, Apr. 3-7, 2017, R1-1704457, pp. 1-11, Retrieved from the Internet: URL: http://www.3gpp.org/ftp/tsg_ran/WG1_RL1/TSGR1_88b/Docs/R1-1704457.zip.
Nokia, et al., "WF on Candidate LDPC Base Matrices" [online], 3GPP Draft, 3GPP TSG RAN WG1 Meeting #89, R1-1709751, Hangzhou, China, May 15-19, 2017, 34 Pages, Retrieved from the Internet: URL: http://www.3gpp.org/ftp/tsg_ran/WG1_RL1/TSGR1_89/Docs/R1-1709751.zip.
Nokia: "Structured LDPC Code Design," 11-04-1362-00-000n-structured-ldpc-code-design, IEEE Draft, 11-04-1362-00-000N-Structured-LDPC-Code-Design, IEEE 802.11-04/1362r0, IEEE-SA Mentor, Piscataway, NJ, USA, vol. 802.11n, Nov. 5, 2004 (Nov. 5, 2004), pp. 1-11, XP017690013, [retrieved on Nov. 5, 2004]. https://mentor.ieee.org/802.11/dcn/04/11-04-1362-00-000n-structured-ldpc-codedesign.doc).
Notice of Reasons for Rejection for Japan Patent Application No. 2021-070978 dated Apr. 25, 2022, 26 pages.
Qualcomm Incorporated: "LDPC Rate Compatible Design", 3GPP Draft, 3GPP TSG-RAN WG1 Ad Hoc, R1-1700830_LDPC_Rate_Compatible_Design, 3rd Generation Partnership Project (3GPP), Mobile Competence Centre, 650, Route Des Lucioles, F-06921 Sophia-Antipolis Cedex, France, vol. RAN WG1, No. Spokane, USA, Jan. 16, 2017-Jan. 20, 2017, Jan. 16, 2017 (Jan. 16, 2017), 19 Pages, XP051208349, Jan. 10, 2017, Retrieved from the Internet: URL: http://www.3gpp.org/ftp/Meetings_3GPP_SYNC/RAN1/Docs/ [retrieved on Jan. 16, 2017].
Qualcomm Incorporated: "LDPC Rate Compatible Design" [online], 3GPP Draft, 3GPP TSG-RAN WG1 #89ah, R1-1711213, Qingdao, China, Jun. 27-30, 2017, pp. 1-11, Retrieved from the Internet URL: http://www.3gpp.org/ftp/tsg_ran/WG1_RL1/TSGR1_AH/NR_AH_1706/Docs/R1-1711213.zip.
Taiwan Search Report—TW107119819—TIPO—dated Nov. 18, 2021.
Xu, R., et al., "High Girth LDPC Coding for OFDMA PHY", C80216e-05_031", IEEE Draft, IEEE 802.16 Broadband Wireless Access Working Group, No. IEEE C802.16e-05/031, IEEE-SA, Piscataway, NJ USA, vol. 802.16e, Jan. 10, 2005 (Jan. 10, 2005), XP017625511, pp. 1-11, [retrieved on Feb. 15, 2005], Retrieved from the Internet: URL: http://ieee802.org/16.
Bing L., et al., "Unequal Error Protection Nonbinary LDPC Codes for Bandwidth Efficient Transmission", Signal processing, vol. 27, No. 7, Jul. 7, 2011, 7 Pages.
Samsung: "LDPC Code for BG1", 3GPP TSG RAN WG1 NR#2, R1-1710744, Qingdao, China, Jun. 27-30, 2017, 3 Pages.
Samsung: "LDPC Code for BG2", 3GPP TSG RAN WG1 NR#2, R1-1710745, Qingdao, China, Jun. 27-30, 2017, 3 Pages.
EP Response Dated Nov. 7, 2023 to the Official Communication EP Application No. 18735108.5, 17 Pages.
EPO Communication Under Rule 71(3) EPC for Application No. 18735108.5, mailing date of Jan. 4, 2024.
Mackay D.J.C., "Good Error-Correcting Codes Based on Very Sparse Matrices," IEEE Transactions on Information Theory, Mar. 1999, vol. 45 (2), pp. 399-431.
Roth C., et al., "A 15.8 pJ/bit/iter Quasi-Cyclic LDPC Decoder for IEEE 802.11n in 90 nm CMOS," IEEE Asian Solid-State Circuits Conference, Nov. 8-10, 2010, 4 pages.
Zhang Z., et al., "An Efficient 10GBASE-T Ethernet LDPC Decoder Design With Low Error Floors," IEEE Journal of Solid-State Circuits, Apr. 2010, vol. 45 (4), pp. 843-855.
Ericsson: "Design Parameters and Implementation Aspects of LPDC Codes," 3GPP Draft; R1-1703537 Design Parameters and Implementation Aspects of LDPC Codes, 3rd Generation Partnership Project (3GPP), Mobile Competence Centre; 650, Route Des Lucioles; F-06921 Sophia-Antipolis, vol. RAN WG1, No. Athens, Greece; Feb. 13, 2017-Feb. 17, 2017, Feb. 15, 2017, XP051222070, 10 pages, Retrieved from the Internet: URL: http://www.3gpp.org/ftp/tsg_ran/WG1_RL1/TSGR1_88/Docs/ [retrieved on Feb. 15, 2017].
International Search Report and Written Opinion—PCT/US2018/036726—ISA/EPO—dated Sep. 7, 2018.
Richardson T., et al., "Design of Low-Density Parity Check Codes for 5G New Radio," IEEE Communications Magazine, vol., 56 (3), Mar. 1, 2018, pp. 28-34, XP055480192.
Ericsson: "System Information for Low Complexity and Extended Coverage", 3GPP Draft; R1-1708730—Sysinfo for Low Complexity and Ext Coverage, 3rd Generation Partnership Project (3GPP), Mobile Competence Centre; 650, Route Des Lucioles, F-06921 Sophia-Antipolis Cedex; France, vol. RAN WG1, No. Hangzhou, China; May 15, 2017-May 19, 2017 May 7, 2017, XP051263297, Retrieved from the Internet: URL:http://www.3gpp.org/ftp/tsg_ran/WG1_RL1/TSGR1_89/Docs/ [retrieved on May 7, 2017], 3 pages.
Nokia et al., "LDPC Design for eMBB", 3GPP Draft; R1-1705857_LDPC Design for EMBB, 3rd Generation Partnership Project (3 GPP), Mobile Competence Centre; 650, Route Des Lucioles; F-06921 Sophia-Antipolis Cedex; France, vol. RAN WG1, No. Spokane, WA, USA; Apr. 3, 2017-Apr. 7, 2017 Mar. 24, 2017, XP051250965, Retrieved from the Internet: URL:http://www.3gpp.org/ftp/tsg_ran/WG1_RL1/TSGR1_88b/Docs/ [retrieved on Mar. 24, 2017], 8 pages.
Qualcomm Incorporated: "LDPC Rate Matching", 3GPP Draft; R1-1708640_LDPC RATE_MATCHING, 3rd Generation Partnership Project (3GPP), Mobile Competence Centre; 650, Route Des Lucioles; F-06921 Sophia-Antipolis Cedex; France, vol. RAN WG1, No. Hangzhou, China; May 15, 2017-May 19, 2017 May 14, 2017,

(56) References Cited

OTHER PUBLICATIONS

XP051273827, Retrieved from the Internet: URL:http://www.3gpp.org/ftp/Meetings_3GPP_SYNC/RAN1/Docs/ [retrieved on May 14, 2017], 3 pages.
Abbasfar A., et al., "Accumulate Repeat Accumulate Codes", Dec. 2, 2003, XP002585965, Retrieved from the Internet: URL: http://trs-new.jpl.nasa.gov/dspace/bitstream/2014/8047/1/03-3469.pdf [retrieved on Jun. 4, 2010], 6 pages.
Alcatel-Lucent et al., "LDPC Coding Proposal for LBC", 3GPP2 Draft; C30-20070226-002_C30-20070212-034R1_AHLQRZ_LDPC_PROPOSAL_FOR_LBC, Mar. 27, 2007, XP062206073, Retrieved from the Internet: URL:http://ftp.3gpp2.org/TSGC/Working/2007/2007-03-Atlanta/TSG-C-2007-03-At1anta/WG3/LDPC Ad Hoc Call,Feb. 26, 2007/ pp. 1-27.
Alcatel-Lucent et al., "LDPC Coding Proposal for LBC", 3GPP2-Drafts, 2500 Wilson Boulevard, Suite 300, Arlington, Virginia 22201, USA, Mar. 15, 2007, XP040477608, 32 pages.
Arikan E., "A Survey of Reed-Muller Codes From Polar Coding Perspective", Information Theory Workshop (ITW), Piscataway, NJ, USA, Jan. 6, 2010, pp. 1-5, XP031703947, ISBN: 978-1-4244-6372-5.
Arikan E., "Channel Polarization: a Method for Constructing Capacity-Achieving Codes for Symmetric Binary-Input Memoryless Channels," IEEE Transactions on Information Theory, vol. 55 (7), 2009, pp. 3051-3073, XP080428257.
Chen B., et al., "List Viterbi Algorithms for Continuous Transmission", IEEE Transactions on Communications, vol. 49 No. 5, XP011009921, May 1, 2001, pp. 784-792.
Chen T.Y., et al., "Protograph-based Raptor-Like LDPC Codes with Low Thresholds", IEEE International Conference on Communications, Jun. 10, 2012, DOI: 10.1109/ICC.2012.6363996, ISBN: 978-1-4577-2052-9, pp. 2161-2165.
Chiu M.C., et al., "Reduced-Complexity SCL Decoding of Multi-CRC-Aided Polar Codes", Sep. 28, 2016, XP055384603, pp. 1-9, Retrieved from the Internet: URL:https://arxiv.org/pdf/1609.08813.pdf [retrieved on Jun. 23, 2017].
Deng X., et al., "Segmented Cyclic Redundancy Check: A Data Protection Scheme for Fast Reading RFID Tag's Memory," IEEE Wireless Communications and Networking Conference, 2008, pp. 1576-1581.
El-Khamy M., et al., "Binary Polar Codes are Optimized Codes for Bitwise Multistage Decoding", Computer Science, Information Theory.Arxiv.org, Cornell University Library, 201 Olin Library Cornell University Ithaca, NY 14853, Apr. 12. 2016, XP080695103, DOI: 10.1049/E1.2016.0837, 2 pages.
El-Khamy M., et al., "Design of Rate Compatible Structured LDPC Codes for Hybrid ARQ Applications", IEEE, Aug. 1, 2009, vol. 27(6), pp. 965-973.
Ericsson: "Performance and Complexity of Per-Segment CRC Attachment Methods" 3GPP Draft; R1-073741, 3rd Generation Partnership Project (3GPP), Mobile Competence Centre, 650, Route Des Lucioles, F-06921, Sophia-Antipolis Cedex, France, vol. RAN WG1, No. Athens, Greece; Aug. 15, 2007, XP050107330, 3 pages.
Hashemi S.A., et al., "Partitioned Successive-Cancellation List Decoding of Polar Codes", 2016 IEEE International Conference on Acoustics. Speech and Signal Processing (ICASSP), Mar. 20, 2016, pp. 957-960, XP032900743, DOI: 10.1109/ICASSP.2016.7471817, [retrieved on May 18, 2016].
IEEE: "IEEEStd 802.16e-2005, Air Interface for Fixed and Mobile Broadband Wireless Access Systems," Amendment 2 and Corrigendum 1 to IEEE Std 802.16/2004, IEEE STD 802.16E-2005, Feb. 28, 2006 (Feb. 28, 2006), pp. 626-630, XP002515198.
"IEEE Standard for Local and Metropolitan Area Networks Part 16: Air Interface for Broadband Wireless Access Systems; IEEE Std 802.16/2009 (Revision of IEEE Std 80216-2004)", May 29, 2009, XP068045637, ISBN: 978-0-7381-5919-5, pp. 1-2080.
Jiang M., et al., "An improved Variable Length Coding Scheme Using Structured LPDC Codes", IEEE, Oct. 1, 2010, 5 Pages.
Jun Lin et al., "A reduced latency list decoding algorithm for polar codes", 2014 IEEE Workshop on Signal Processing Systems (SIPS), Oct. 1, 2014, p. 1-6.
Liu J., et al., "Rate-Compatible LDPC Codes with Short Block Lengths Based on Puncturing and Extension Techniques," 2014, pp. 1-20.
Lucas R et al., "Improved Soft-Decision Decoding of Reed-Muller Codes as Generalized Multiple Concatenated Codes", ITG-FACHBERI, vol. 183, VDE-VERLAG, DE, No. 146, Mar. 5, 1998, pp. 137-142.
Mahdavifar H., et al., "On the Construction and Decoding of Concatenated Polar Codes", IEEE International Symposium on Information Theory, Jul. 7, 2013, pp. 952-956, XP032497043, ISSN: 2157-8095, DOI: 10.1109/ISIT.2013.6620367 [retrieved on Oct. 3, 2013].
Mediatek Inc: "Multi-Codebook Embedded Compact QC-LDPC Designs", 3GPP TSG-RAN WG1 NR, R1-1706175, Apr. 4, 2017, XP051252463, Retrieved from the Internet: URL:http://www.3gpp.org/ftp/tsg_ran/WG1_RL1/TSGR1_88b/Docs/, 14 pages.
Myung S., et al., "Extension of Quasi-cyclic LDPC Codes by Lifting," Proc ., IEEE International Symposium on Information Theory, ISIT 2005, Adelaide, Australia, Sep. 4, 2005 (Sep. 4, 2005),-Sep. 9, 2005 (Sep. 9, 2005), pp. 2305-2309, XP010845965, ISBN: 978-0-7803-9151-2.
Myung S., et al., "Lifting Methods for Quasi-Cyclic LDPC Codes", IEEE Communications Letters, Jun. 2006, vol. 10, No. 6, pp. 489-491.
Nguyen T.V., et al., "The Design of Rate-Compatible Protograph LDPC Codes", IEEE Transactions on Communications, Oct. 1, 2012, vol. 60, No. 10, XP011469171, ISSN: 0090-6778, DOI: 10.1109/TCOMM.2012.081012.110010, pp. 2841-2850.
Niu K., et al., "CRC-Aided Decoding of Polar Codes," IEEE Communications Letters, Oct. 2012, vol. 16, No. 10, pp. 1668-1671.
Qualcomm Incorporated: "LDPC Codes—HARQ, Rate", 3GPP Draft; R1-162209, LDPC_RATECOMPATIBILITY_HIGHLEVELDESIGN, 3rd Generation Partnership Project (3GPP), Mobile Competence Centre, 650, Route Des Lucioles; F06921 Sophia-Antipolis Cedex; France, vol. RAN WG1, No. Busan, Korea; Apr. 2, 2016, XP051080037, Retrieved from the Internet: URL:http://www.3gpp.org/ftp/tsg_ran/WG1_RL1/TSGR1_84b/Docs/, 4 pages.
Qualcomm Incorporated: "LDPC Rate Compatible Design Overview", 3GPP Draft; R1-1610137, 3rd Generation Partnership Project (3GPP), Mobile Competence Centre, 650, Route Des Lucioles; F-06921; Sophia-Anti Polis Cedex. vol. Ran WG1. No. Lisbon, Portugal, Oct. 9, 2016, 27 pages, XP051150160, Retrieved from the Internet: URL: http://www.3gpp.org/ftp/Meetings_3GPP_SYNC/RAN1/Docs/ [retrieved on Oct. 9, 2016].
Shea J.M., et al., "Multidimensional Codes" In: "Wiley Encyclopedia of Telecommunications," Jan. 1, 2003, vol. 3, pp. 1538-1551, XP055402230.
Tal I., et al., "List Decoding of Polar Codes", IEEE Transactions on Information Theory, Institute of Electrical and Electronics Engineers, May 2015, vol. 61, No. 5, pp. 2213-2226.
<span style:"font-family: calibri,">Guo J., et al., "Multi-CRC Polar Codes and Their Applications", IEEE Communications Letters,< span style:="font-family: calibri;">Feb. 22, 2016, vol. 20, No. 2, pp, 212-215.
Arikan E.. "Challenges and some new directions in channel coding," Computer Science, Information Theory, arXiv:1504.03916, Apr. 15, 2015, 11 pages.
Leroux C., et al., "A Semi-Parallel Successive-Cancellation Decoder for Polar Codes," IEEE Transactions on Signal Processing, Jan. 2013, vol. 61, No. 2, pp. 1-11.
Mahdavifar H., et al., "Fast Multi-dimensionai Polar Encoding and Decoding," Information Theory and Applications Workshop (ITA), IEEE, 2014, 5 pages.
Stolte N., Rekursive Codes mit der Plotkin-Konstruktion and ihre Decodierung, D17 Darmstadter Dissertation, Jan. 1, 2002, 151 pages, (in particular, pp. 13-30), XP055241445, URL:http:1/tuprints.ulb.tu-darmstadt.de/epda/000183/stolte.pdf, Techn. Universitat, Diss., 2002 (Nicht f. d. Austausch)_Darmstadt [retrieved on Jan. 14, 2016].

(56) References Cited

OTHER PUBLICATIONS

Surra S.A., et al., "Gigabit Rate Achieving Low-Power LDPC Codes: Design and Architecture", IEEE, Mar 1, 2011, pp. 1994-1999.
Tal I., et al., "List Decoding of Polar Codes", IEEE Transactions on Information Theory, May 31, 2012, pp. 1-11.
Trifonov P., "Efficient Design and Decoding of Polar Codes", IEEE Transactions on Communications, vol. 60, No. 11, Nov. 1, 2012, XP011473857, ISSN: 0090-6778, DOI: 10.1109/TCOMM.2012.081512.110872, pp. 3221-3227.
Trifonov P., et al., "Generalized Concatenated Codes based on Polar Codes", 8th International Symposium on Wireless Communication Systems, Nov. 6, 2011, XP032090122, pp. 442-446, DOI: 10.1109/ISWCS.2011.6125399, ISBN: 978-1-61284-403-9.
Trifonov P., et al., "Fast Encoding of Polar Codes with Reed-Solomon Kernel," IEEE Transactions on Communications, May 2016, pp. 1-8.
Wang T., et al., "Parity-Check-Concatenated Polar Codes", IEEE Communications Letters, IEEE Service Center, Piscataway, NJ, US, vol. 20, No. 12, Dec. 1, 2016, pp. 2342-2345, XP011636292, ISSN: 1089-7798, DOI: 10.1109/LCOMM.2016.2607169 [retrieved on Dec. 8, 2016].
Wang Y., et al., "Concatenations of Polar Codes With Outer BCH Codes and Convolutional Codes", 2014 52nd Annual Allerton Conference on Communication, Control, and Computing (ALLERTON), Sep. 30, 2014, pp. 813-819, XP032731136, DOI: 10.1109/ALLERTON.20147028538 [retrieved on Jan. 30, 2015].
Xie Y., et al., "Design of Rate Compatible Protograph-based LDPC Codes with Mixed Circulants", IEEE, 6th International Symposium on Turbo Codes & Iterative Information Processing, Sep. 2010, pp. 434-438.
Zhou H., et al., "Segmented CRC-Aided SC List Polar Decoding", 2016 IEEE 83rd Vehicular Technology Conference, May 15, 2016, XP032918751, pp. 1-5, DOI: 10.1109/VTCSPRING.2016.7504469, [retrieved on Jul. 5, 2016].
ZTE: "Structured LDPC Coding with Rate Matching", 3GPP Draft; R1-060115, Mobile Competence Centre ; 650, Route Des Lucioles; F-06921 Sophia-Antipolis Cedex; France, vol. RAN WG1, No. Helsinki, Finland; Jan. 19, 2006, XP050950962, Retrieved from the Internet: URL:http://www.3gpp.org/ftp/tsg_ran/WG1_RL1/TSGR1_AH/LTE_AH_0601/Docs/, 13 pages.
Interdigital Inc: "Code Block Segmentation for Data Channel", 3GPP Draft; R1-1710958, Code Block Segmentation for Data Channel, 3rd Generation Partnership Project (3GPP), Mobile Competence Centre; 650 Route Des Lucioles; F-06921, Sophia-Antipolis Cedex; France, vol. RAN WG1, No. Qingdao; Jun. 27, 2017-Jun. 30, 2017, Jun. 26, 2017 (Jun. 26, 2017), XP051300159, Retrieved from the Internet: URL: http://www.3gpp.org/ftp/Meetings_3GPP_SYNC/RAN1/Docs/, [retrieved on Jun. 26, 2017].
International Search Report and Written Opinion—PCT/US2018/040507—ISA/EPO—dated Oct. 15, 2018.
ZTE: "NR LDPC Design", 3GPP Draft, R1-1709289, NR LDPC design, 3rd Generation Partnership ProjecT (3GPP), Mobile Competence Centre; 650, Route Des Lucioles; F-06921, Sophia- Antipolis Cedex; France, vol. RAN WG1, No. Hangzhou, China; May 15, 2017-May 19, 2017, May 16, 2017 (May 16, 2017), XP051285041, pp. 1-12, Retrieved from the Internet: URL: http://www.3gpp.org/ftp/tsg_ran/WG1_RL1/TSGR1_89/Docs/ [retrieved on May 16, 2017].
Qualcomm Incorporated: "LDPC Segmentation", 3GPP Draft; RI-1711211, LDPC Segmentation, 3rd Generation Partnership Project (3GPP), Mobile Competence Centre, 650, Route Des Lucioles, F-06921, Sophia-Cedex, France, vol. RAN WG1, No. Qingdao, China; Jun. 27, 2017-Jun. 30, 2017, Jun. 26, 2017 (Jun. 26, 2017), XP051300410, pp. 1-6, Retrieved from the Internet: URL: http://www.3gpp.org/ftp/Meetings_3GPP_SYNC/RANI/Docs/ , [retrieved on Jun. 26, 2017].

* cited by examiner

700A $$H = \begin{bmatrix} 1 & 1 & 1 & 0 & 0 \\ 1 & 0 & 0 & 1 & 1 \\ 1 & 1 & 0 & 0 & 1 \\ 0 & 1 & 1 & 1 & 0 \end{bmatrix} \qquad x = \begin{bmatrix} x_1 \\ x_2 \\ x_3 \\ x_4 \\ x_5 \end{bmatrix}$$

COMMUNICATION TECHNIQUES INVOLVING PAIRWISE ORTHOGONALITY OF ADJACENT ROWS IN LPDC CODE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATION & PRIORITY CLAIM

[This application claims benefit of and priority to U.S. Provisional Patent Application Ser. No. 62/517,916, filed Jun. 10, 2017, and also U.S. Provisional Patent Application Ser. No. 62/522,044, filed Jun. 19, 2017. Both of said applications are herein incorporated by reference in their entireties as if fully set forth below and for all applicable purposes.]*This application is reissue of U.S. Pat. No. 10,312,939, issued on Jun. 4, 2019 which was filed as U.S. patent application Ser. No. 16/003,047, filed Jun. 7, 2018. U.S. patent application Ser. No. 16/003,047 claims benefit of and priority to U.S. Provisional Patent Application Ser. No. 62/517,916, filed Jun. 10, 2017, and also U.S. Provisional Patent Application Ser. No. 62/522,044, filed Jun. 19, 2017, both of said applications are herein incorporated by reference in their entireties as if fully set forth below and for all applicable purposes.*

TECHNICAL FIELD

Aspects of the present disclosure relate to wireless communications, and more particularly, to techniques for coding using low-density parity-check (LDPC) codes. In some embodiments, the LDPC codes can be arranged in or have pairwise orthogonality of adjacent rows in a parity check matrix (PCM) describing the code. Embodiments also include new modules (e.g., hardware) such as a new encoder/decoder configured for leveraging LDPC coding with pairwise row orthogonality to perform flexible encoder/decoder scheduling without performance loss and advantageous hardware processing

INTRODUCTION

Wireless communication systems are widely deployed to provide various telecommunication services such as telephony, video, data, messaging, broadcasts, etc. These wireless communication systems may employ multiple-access technologies capable of supporting communication with multiple users by sharing available system resources (e.g., bandwidth, transmit power, etc.). Examples of such multiple-access systems include 3rd Generation Partnership Project (3GPP) Long Term Evolution (LTE) systems, LTE Advanced (LTE-A) systems, code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems, to name a few.

In some examples, a wireless multiple-access communication system may include a number of base stations (BSs), which are each capable of simultaneously supporting communication for multiple communication devices, otherwise known as user equipments (UEs). In an LTE or LTE-A network, a set of one or more base stations may define an eNodeB (eNB). In other examples (e.g., in a next generation, a new radio (NR), or 5G network), a wireless multiple access communication system may include a number of distributed units (DUs) (e.g., edge units (EUs), edge nodes (ENs), radio heads (RHs), smart radio heads (SRHs), transmission reception points (TRPs), etc.) in communication with a number of central units (CUs) (e.g., central nodes (CNs), access node controllers (ANCs), etc.), where a set of one or more DUs, in communication with a CU, may define an access node (e.g., which may be referred to as a BS, 5G NB, next generation NodeB (gNB or gNodeB), transmission reception point (TRP), etc.). ABS or DU may communicate with a set of UEs on downlink channels (e.g., for transmissions from a BS or DU to a UE) and uplink channels (e.g., for transmissions from a UE to BS or DU).

These multiple access technologies have been adopted in various telecommunication standards to provide a common protocol that enables different wireless devices to communicate on a municipal, national, regional, and even global level. NR (e.g., new radio or 5G) is an example of an emerging telecommunication standard. NR is a set of enhancements to the LTE mobile standard promulgated by 3GPP. NR is designed to better support mobile broadband Internet access by improving spectral efficiency, lowering costs, improving services, making use of new spectrum, and better integrating with other open standards using OFDMA with a cyclic prefix (CP) on the downlink (DL) and on the uplink (UL). To these ends, NR supports beamforming, multiple-input multiple-output (MIMO) antenna technology, and carrier aggregation.

Binary values (e.g., ones and zeros), are used to represent and communicate various types of information, such as video, audio, statistical information, etc. Unfortunately, during storage, transmission, and/or processing of binary data, errors may be unintentionally introduced; for example, a "1" may be changed to a "0" or vice versa.

Generally, in the case of data transmission, a receiver observes each received bit in the presence of noise or distortion and only an indication of the bit's value is obtained. Under these circumstances, the observed values are interpreted as a source of "soft" bits. A soft bit indicates a preferred estimate of the bit's value (e.g., a 1 or a 0) together with some indication of the reliability of that estimate. While the number of errors may be relatively low, even a small number of errors or level of distortion can result in the data being unusable or, in the case of transmission errors, may necessitate re-transmission of the data. In order to provide a mechanism to check for errors and, in some cases, to correct errors, binary data can be coded to introduce carefully designed redundancy. Coding of a unit of data produces what is commonly referred to as a codeword. Because of its redundancy, a codeword will often include more bits than the input unit of data from which the codeword was produced.

Redundant bits are added by an encoder to the transmitted bit stream to create a code word. When signals arising from transmitted code words are received or processed, the redundant information included in the code word as observed in the signal can be used to identify and/or correct errors in or remove distortion from the received signal in order to recover the original data unit. Such error checking and/or correcting can be implemented as part of a decoding process. In the absence of errors, or in the case of correctable errors or distortion, decoding can be used to recover from the source data being processed, the original data unit that was encoded. In the case of unrecoverable errors, the decoding process may produce some indication that the original data cannot be fully recovered. Such indications of decoding failure can be used to initiate retransmission of the data. As the use of fiber optic lines for data communication and increases in the rate at which data can be read from and stored to data storage devices (e.g., disk drives, tapes, etc.) increases, there is an increasing need for efficient use of data storage and transmission capacity and also for the ability to encode and decode data at high rates of speed.

In the context of 3GPP standardization efforts by interested parties and 3GPP participants, TR.38.912 (Version 14.0.0, March 2017) outlined aspects related to study items under consideration for NR to fulfill requirements of IMT-2020 plans. One area related to channel coding (Section 8.2.1.5). This section discusses channel coding for NR including LDPC (Section 8.2.1.5.1) and discusses some matrix components.

BRIEF SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved communications between access points and stations in a wireless network.

While encoding efficiency and high data rates are important, for an encoding and/or decoding system to be practical for use in a wide range of devices (e.g., consumer devices), it is also important that the encoders and/or decoders can be implemented at reasonable cost. Embodiments of the present invention provide improved communication devices with new, improved hardware components capable of carrying out new, improved encoding and decoding techniques. Encoders and decoders according to embodiments of the present invention can include features as discussed below for leveraging LDPC coding techniques. Embodiments can include LDPC encoder/decoder circuitry comprising circuit features configured to carry out encoding and decoding techniques efficiently and considering device size and operational design considerations. Technical improvements can include faster hardware processing resulting from encoding/decoding using an LPDC code based on base graph having unique orthogonality arrangements.

Communication systems often need to operate at several different rates. Low-density parity-check (LDPC) codes can be used for simple implementation to provide coding and/or decoding at different rates. For example, higher-rate LDPC codes can be generated by puncturing lower-rate LDPC codes.

As the demand for mobile broadband access continues to increase, there exists a need for further improvements in NR technology. Preferably, improvements can or should be applicable to other multi-access technologies and the telecommunication standards that employ these technologies. One area for improvements is the area of encoding/decoding for data transmissions. These improvements (e.g., improved LDPC codes) can be applicable to NR and other access technologies.

Aspects of the present disclosure relate to coding for communications using LDPC codes that have pairwise orthogonality of adjacent rows in the corresponding parity check matrix (PCM) that describes the LDPC code and a new encoder/decoder that exploits the LDPC coding with the pairwise row orthogonality to perform flexible encoder/decoder scheduling without performance loss. Embodiments can include circuits arranged and/or configured to carry out encoding/decoding operations using LDPC codes having pairwise orthogonality. In some embodiments, an encoder or decoder can comprise at least one processor communicatively coupled to a memory device, the encoder or decoder can be configured to implement encoding or decoding leveraging LDPC codes with pairwise orthogonality arrangements.

Certain aspects provide an apparatus for wireless communication by a receiving device. The apparatus generally includes a receiver configured to receive a codeword in accordance with a radio technology across a wireless channel via one or more antenna elements situated proximal the receiver. The apparatus includes at least one processor coupled with a memory and comprising decoder circuitry configured to decode the codeword based on a LDPC code to produce a set of information bits. The LDPC code is stored in the memory and defined by a base matrix having a first number of columns corresponding to variable nodes of a base graph and a second number of rows corresponding to check nodes of the base graph. For each of the first number of columns, all adjacent rows are orthogonal in a last portion of the second number of rows.

Certain aspects provide an apparatus for wireless communication by a transmitting device. The apparatus generally includes at least one processor coupled with a memory and comprising an encoder circuit configured to encode a set of information bits based on a LDPC code to produce a codeword. The LDPC code is stored in the memory and defined by a base matrix having a first number of columns corresponding to variable nodes of a base graph and a second number of rows corresponding to check nodes of the base graph. For each of the first number of columns, all adjacent rows are orthogonal in a last portion of the second number of rows. The apparatus includes a transmitter configured to transmit the codeword in accordance with a radio technology across a wireless channel via one or more antenna elements arranged proximal the transmitter.

Certain aspects provide a method for wireless communication by a receiving device. The method generally includes receiving a codeword in accordance with a radio technology across a wireless channel via one or more antenna elements situated proximal a receiver. The method includes decoding the codeword via decoder circuitry based on a LDPC code to produce a set of information bits. The LDPC code is stored and defined by a base matrix having a first number of columns corresponding to variable nodes of a base graph and a second number of rows corresponding to check nodes of the base graph. For each of the first number of columns, all adjacent rows are orthogonal in a last portion of the second number of rows.

Certain aspects provide a method for wireless communication by a transmitting device. The method generally includes encoding with encoder circuitry a set of information bits based on a LDPC code to produce a codeword. The LDPC code is defined by a base matrix having a first number of columns corresponding to variable nodes of a base graph and a second number of rows corresponding to check nodes of the base graph. For each of the first number of columns, all adjacent rows are orthogonal in a last portion of the second number of rows. The method includes transmitting the codeword in accordance with a radio technology across a wireless channel via one or more antenna elements.

Certain aspects provide an apparatus for wireless communication, such as a receiving device. The apparatus generally includes means for receiving a codeword in accordance with a radio technology across a wireless channel. The apparatus generally includes means for decoding the codeword based on a LDPC code to produce a set of information bits. The LDPC code is defined by a base matrix having a first number of columns corresponding to variable nodes of a base graph and a second number of rows corresponding to check nodes of the base graph. For each of the first number of columns, all adjacent rows are orthogonal in a last portion of the second number of rows.

Certain aspects provide an apparatus for wireless communication, such as a transmitting device. The apparatus generally includes means for encoding a set of information bits based on a LDPC code to produce a codeword. The LDPC code is defined by a base matrix having a first number of columns corresponding to variable nodes of a base graph and a second number of rows corresponding to check nodes of the base graph. For each of the first number of columns, all adjacent rows are orthogonal in a last portion of the second number of rows. The apparatus generally includes means for transmitting the codeword in accordance with a radio technology across a wireless channel.

Certain aspects provide a computer readable medium having computer executable code stored thereon for wireless communication. The computer executable code generally includes code for receiving a codeword in accordance with a radio technology across a wireless channel. The computer executable code generally includes code for decoding the codeword based on a LDPC code to produce a set of information bits. The LDPC code is defined by a base matrix having a first number of columns corresponding to variable nodes of a base graph and a second number of rows corresponding to check nodes of the base graph. For each of the first number of columns, all adjacent rows are orthogonal in a last portion of the second number of rows.

Certain aspects provide a computer readable medium having computer executable code stored thereon for wireless communication. The computer executable code generally includes code for encoding a set of information bits based on a LDPC code to produce a codeword. The LDPC code is defined by a base matrix having a first number of columns corresponding to variable nodes of a base graph and a second number of rows corresponding to check nodes of the base graph. For each of the first number of columns, all adjacent rows are orthogonal in a last portion of the second number of rows. The computer executable code generally includes code for transmitting the codeword in accordance with a radio technology across a wireless channel.

Certain embodiments can include a number of devices capable of communication. For example, some embodiments may include user-based, handheld consumer devices that comprise a housing capable of holding internal circuitry. The internal circuitry can include one or more processors configured to carry out mobile communications and associated memory for storing data and software. The internal circuitry can also include wireless modem features that include encoder/decoder circuitry that may use LPDC codes for encoding or decoding information in wireless communication settings. In another example, an apparatus can comprise: a transceiver capable of wireless communications with at least one network node of a wireless network; and a processor coupled to the transceiver. The processor can comprise an encoder capable of encoding data to provide encoded data by performing operations comprising: encoding the data with a low-density parity-check (LDPC) code having row-wise orthogonality to provide LDPC-coded data. The processor can comprise a decoder capable of decoding data to provide decoded data by performing operations comprising: decoding data with a low-density party-check (LDPC) code having row-wise orthogonality to provide LDPC-decoded data.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
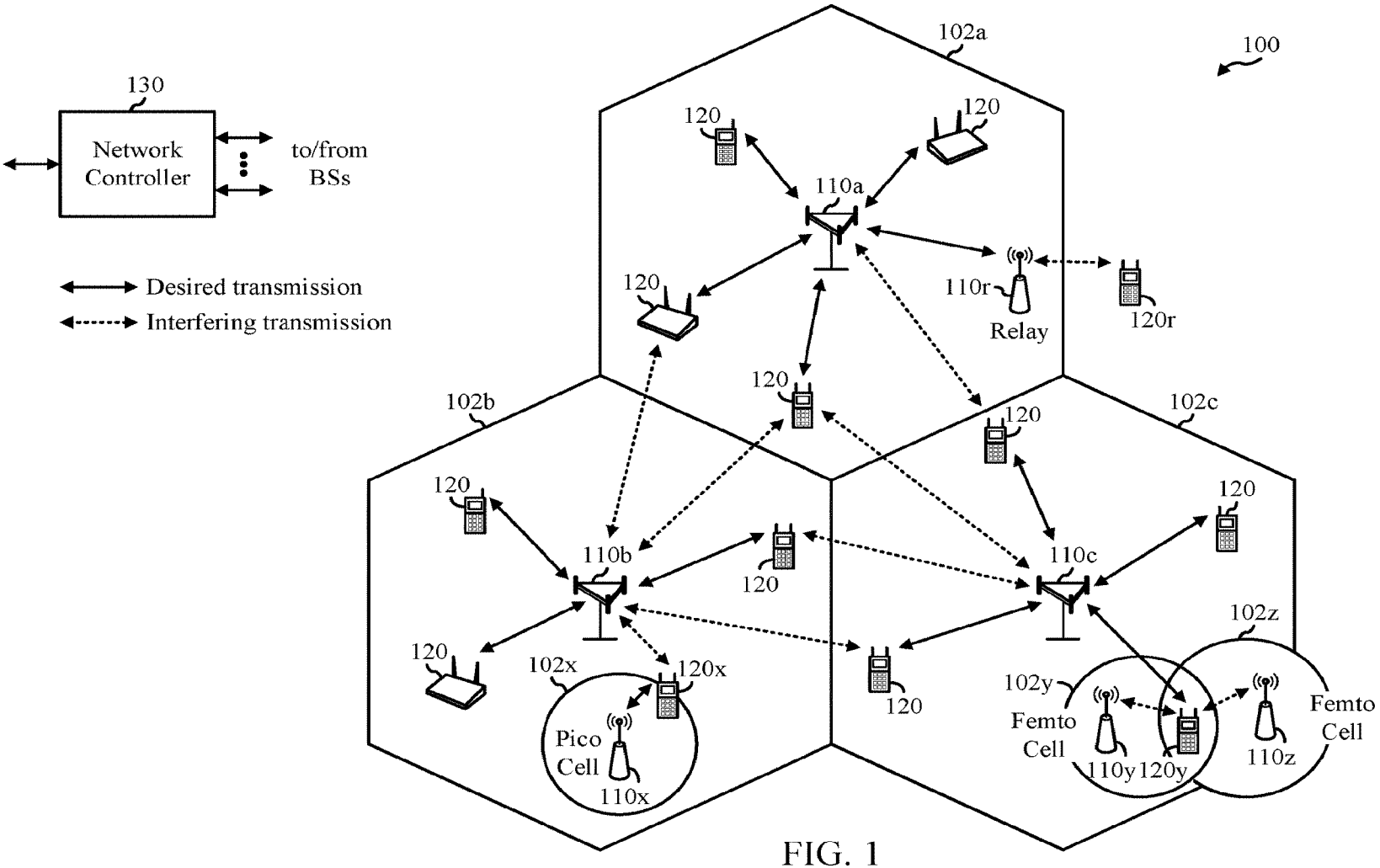
FIG. 1 is a block diagram conceptually illustrating an example telecommunications system, in accordance with certain aspects of the present disclosure.

Aspects of the present disclosure provide apparatus, methods, processing systems, and computer readable mediums for coding for communications using low-density parity-check (LDPC) codes that have pairwise orthogonality of adjacent rows in the corresponding parity check matrix (PCM) that describes the LDPC code.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented, or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The techniques described herein may be used for various wireless communication technologies, such as LTE, CDMA, TDMA, FDMA, OFDMA, SC-FDMA and other networks. The terms "network" and "system" are often used interchangeably. A CDMA network may implement a radio technology such as Universal Terrestrial Radio Access (UTRA), cdma2000, etc. UTRA includes Wideband CDMA (WCDMA) and other variants of CDMA. cdma2000 covers IS-2000, IS-95 and IS-856 standards. A TDMA network may implement a radio technology such as Global System for Mobile Communications (GSM). An OFDMA network may implement a radio technology such as NR (e.g. 5G RA), Evolved UTRA (E-UTRA), Ultra Mobile Broadband (UMB), IEEE 802.11 (Wi-Fi), IEEE 802.16 (WiMAX), IEEE 802.20, Flash-OFDMA, etc. UTRA and E-UTRA are part of Universal Mobile Telecommunication System (UMTS).

New Radio (NR) is an emerging wireless communications technology under development in conjunction with the 5G Technology Forum (5GTF). 3GPP Long Term Evolution (LTE) and LTE-Advanced (LTE-A) are releases of UMTS that use E-UTRA. UTRA, E-UTRA, UMTS, LTE, LTE-A and GSM are described in documents from an organization named "3rd Generation Partnership Project" (3GPP). cdma2000 and UMB are described in documents from an organization named "3rd Generation Partnership Project 2" (3GPP2). The techniques described herein may be used for the wireless networks and radio technologies mentioned above as well as other wireless networks and radio technologies. For clarity, while aspects may be described herein using terminology commonly associated with 3G and/or 4G wireless technologies, aspects of the present disclosure can be applied in other generation-based communication systems, such as 5G and later, including NR technologies.

New radio (NR) access (e.g., 5G technology) may support various wireless communication services, such as enhanced mobile broadband (eMBB) targeting wide bandwidth (e.g., 80 MHz or beyond), millimeter wave (mmW) targeting high carrier frequency (e.g., 25 GHz or beyond), massive machine type communications MTC (mMTC) targeting non-backward compatible MTC techniques, and/or mission critical targeting ultra-reliable low-latency communications (URLLC). These services may include latency and reliability requirements. These services may also have different transmission time intervals (TTI) to meet respective quality of service (QoS) requirements. In addition, these services may co-exist in the same subframe.

While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, embodiments and/or uses may come about via integrated chip embodiments and other non-module-component based devices (e.g., end-user devices, vehicles, communication devices, computing devices, industrial equipment, retail/purchasing devices, medical devices, AI-enabled devices, etc.). While some examples may or may not be specifically directed to use cases or applications, a wide assortment of applicability of described innovations may occur. Implementations may range a spectrum from chip-level or modular components to non-modular, non-chip-level implementations and further to aggregate, distributed, or OEM devices or systems incorporating one or more aspects of the described innovations. In some practical settings, devices incorporating described aspects and features may also necessarily include additional components and features for implementation and practice of claimed and described embodiments. For example, transmission and reception of wireless signals necessarily includes a number of components for analog and digital purposes (e.g., hardware components including antennas, antenna alements arranged or located proximal receiver or transmitter components, RF-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc. of varying sizes, shapes, and constitution.

Example Wireless Communications System

FIG. 1 illustrates an example wireless communication network 100 in which aspects of the present disclosure may be performed. For example, the wireless communication network 100 may be a New Radio (NR) or 5G network. The NR network may use low-density parity-check (LPDC) coding for certain transmissions, in accordance with certain aspects of the present disclosure. For example, a transmitting device, such as a base station (BS) 110 on the downlink or a user equipment (UE) 120 on the uplink, can encode information bits for transmission to a receiving device in the wireless communication network 100. The transmitting device encodes the information bits for certain transmissions using LDPC code. The base graph associated with the LDPC code may have pairwise row orthogonality in a lower portion of the base graph. The receiving device, such as the UE 120 on the downlink or the BS 110 on the uplink, receives the encoded transmission from the transmitting device and decodes the transmission to obtain the information. The receiving device may exploit the pairwise row orthogonality in the decoder for more flexible decoder scheduling.

As illustrated in FIG. 1, the wireless communication network 100 may include a number of base stations (BSs) 110 and other network entities. A BS may be a station that communicates with user equipments (UEs). Each BS 110 may provide communication coverage for a particular geographic area. In 3GPP, the term "cell" can refer to a coverage area of a Node B (NB) and/or a NB subsystem serving this coverage area, depending on the context in which the term is used. In NR systems, the term "cell" and next generation NB (gNB or gNodeB), NR BS, 5G NB, access point (AP), or transmission reception point (TRP) may be interchangeable. In some examples, a cell may not necessarily be stationary, and the geographic area of the cell may move according to the location of a mobile BS. In some examples, the base stations may be interconnected to one another and/or to one or more other base stations or network nodes (not shown) in wireless communication network 100 through various types of backhaul interfaces, such as a direct physical connection, a wireless connection, a virtual network, or the like using any suitable transport network.

In general, any number of wireless networks may be deployed in a given geographic area. Each wireless network may support a particular radio access technology (RAT) and may operate on one or more frequencies. A RAT may also be referred to as a radio technology, an air interface, etc. A frequency may also be referred to as a carrier, a subcarrier, a frequency channel, a tone, a subband, etc. Each frequency may support a single RAT in a given geographic area in order to avoid interference between wireless networks of different RATs. In some cases, NR or 5G RAT networks may be deployed.

A BS may provide communication coverage for a macro cell, a pico cell, a femto cell, and/or other types of cells. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having an association with the femto cell (e.g., UEs in a Closed Subscriber Group (CSG), UEs for users in the home, etc.). A BS for a macro cell may be referred to as a macro BS. A BS for a pico cell may be referred to as a pico BS. A BS for a femto cell may be referred to as a femto BS or a home BS. In the example shown in FIG. 1, the BSs 110a, 110b and 110c may be macro BSs for the macro cells 102a, 102b and 102c, respectively. The BS 110x may be a pico BS for a pico cell 102x. The BSs 110y and 110z may be femto BSs for the femto cells 102y and 102z, respectively. A BS may support one or multiple (e.g., three) cells.

Wireless communication network 100 may also include relay stations. A relay station is a station that receives a transmission of data and/or other information from an upstream station (e.g., a BS or a UE) and sends a transmission of the data and/or other information to a downstream station (e.g., a UE or a BS). A relay station may also be a UE that relays transmissions for other UEs. In the example shown in FIG. 1, a relay station 110r may communicate with the BS 110a and a UE 120r in order to facilitate communication between the BS 110a and the UE 120r. A relay station may also be referred to as a relay BS, a relay, etc.

Wireless communication network 100 may be a heterogeneous network that includes BSs of different types, e.g., macro BS, pico BS, femto BS, relays, etc. These different types of BSs may have different transmit power levels, different coverage areas, and different impact on interference in the wireless communication network 100. For example, macro BS may have a high transmit power level (e.g., 20 Watts) whereas pico BS, femto BS, and relays may have a lower transmit power level (e.g., 1 Watt).

Wireless communication network 100 may support synchronous or asynchronous operation. For synchronous operation, the BSs may have similar frame timing, and transmissions from different BSs may be approximately aligned in time. For asynchronous operation, the BSs may have different frame timing, and transmissions from different BSs may not be aligned in time. The techniques described herein may be used for both synchronous and asynchronous operation.

A network controller 130 may couple to a set of BSs and provide coordination and control for these BSs. The network controller 130 may communicate with the BSs 110 via a backhaul. The BSs 110 may also communicate with one another (e.g., directly or indirectly) via wireless or wireline backhaul.

The UEs 120 (e.g., 120x, 120y, etc.) may be dispersed throughout the wireless communication network 100, and each UE may be stationary or mobile. A UE may also be referred to as a mobile station, a terminal, an access terminal, a subscriber unit, a station, a Customer Premises Equipment (CPE), a cellular phone, a smart phone, a personal digital assistant (PDA), a wireless modem, a wireless communication device, a handheld device, a laptop computer, a cordless phone, a wireless local loop (WLL) station, a tablet computer, a camera, a gaming device, a netbook, a smartbook, an ultrabook, an appliance, a medical device or medical equipment, a biometric sensor/device, a wearable device such as a smart watch, smart clothing, smart glasses, a smart wrist band, smart jewelry (e.g., a smart ring, a smart bracelet, etc.), an entertainment device (e.g., a music device, a video device, a satellite radio, etc.), a vehicular component or sensor, a smart meter/sensor, industrial manufacturing equipment, a global positioning system device, or any other suitable device that is configured to communicate via a wireless or wired medium. Some UEs may be considered machine-type communication (MTC) devices or evolved MTC (eMTC) devices. MTC and eMTC UEs include, for example, robots, drones, remote devices, sensors, meters, monitors, location tags, etc., that may communicate with a BS, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, which may be narrowband IoT (NB-IoT) devices.

Certain wireless networks (e.g., LTE) utilize orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kHz and the minimum resource allocation (called a "resource block" (RB)) may be 12 subcarriers (or 180 kHz). Consequently, the nominal Fast Fourier Transfer (FFT) size may be equal to 128, 256, 512, 1024 or 2048 for system bandwidth of 1.25, 2.5, 5, 10, or 20 megahertz (MHz), respectively. The system bandwidth may also be partitioned into subbands. For example, a subband may cover 1.08 MHz (i.e., 6 resource blocks), and there may be 1, 2, 4, 8, or 16 subbands for system bandwidth of 1.25, 2.5, 5, 10 or 20 MHz, respectively.

While aspects of the examples described herein may be associated with LTE technologies, aspects of the present disclosure may be applicable with other wireless communications systems, such as NR. NR may utilize OFDM with a CP on the uplink and downlink and include support for half-duplex operation using TDD. Beamforming may be supported and beam direction may be dynamically configured. MIMO transmissions with precoding may also be supported. MIMO configurations in the DL may support up to 8 transmit antennas with multi-layer DL transmissions up to 8 streams and up to 2 streams per UE. Multi-layer transmissions with up to 2 streams per UE may be supported. Aggregation of multiple cells may be supported with up to 8 serving cells.

In some examples, access to the air interface may be scheduled, wherein a. A scheduling entity (e.g., a base station) allocates resources for communication among some or all devices and equipment within its service area or cell. The scheduling entity may be responsible for scheduling, assigning, reconfiguring, and releasing resources for one or more subordinate entities. That is, for scheduled communication, subordinate entities utilize resources allocated by the scheduling entity. Base stations are not the only entities that may function as a scheduling entity. In some examples, a UE may function as a scheduling entity and may schedule resources for one or more subordinate entities (e.g., one or more other UEs), and the other UEs may utilize the resources scheduled by the UE for wireless communication. In some examples, a UE may function as a scheduling entity in a peer-to-peer (P2P) network, and/or in a mesh network. In a mesh network example, UEs may communicate directly with one another in addition to communicating with a scheduling entity.

In FIG. 1, a solid line with double arrows indicates desired transmissions between a UE and a serving BS, which is a BS designated to serve the UE on the downlink and/or uplink. A finely dashed line with double arrows indicates interfering transmissions between a UE and a BS.

Figure 2:
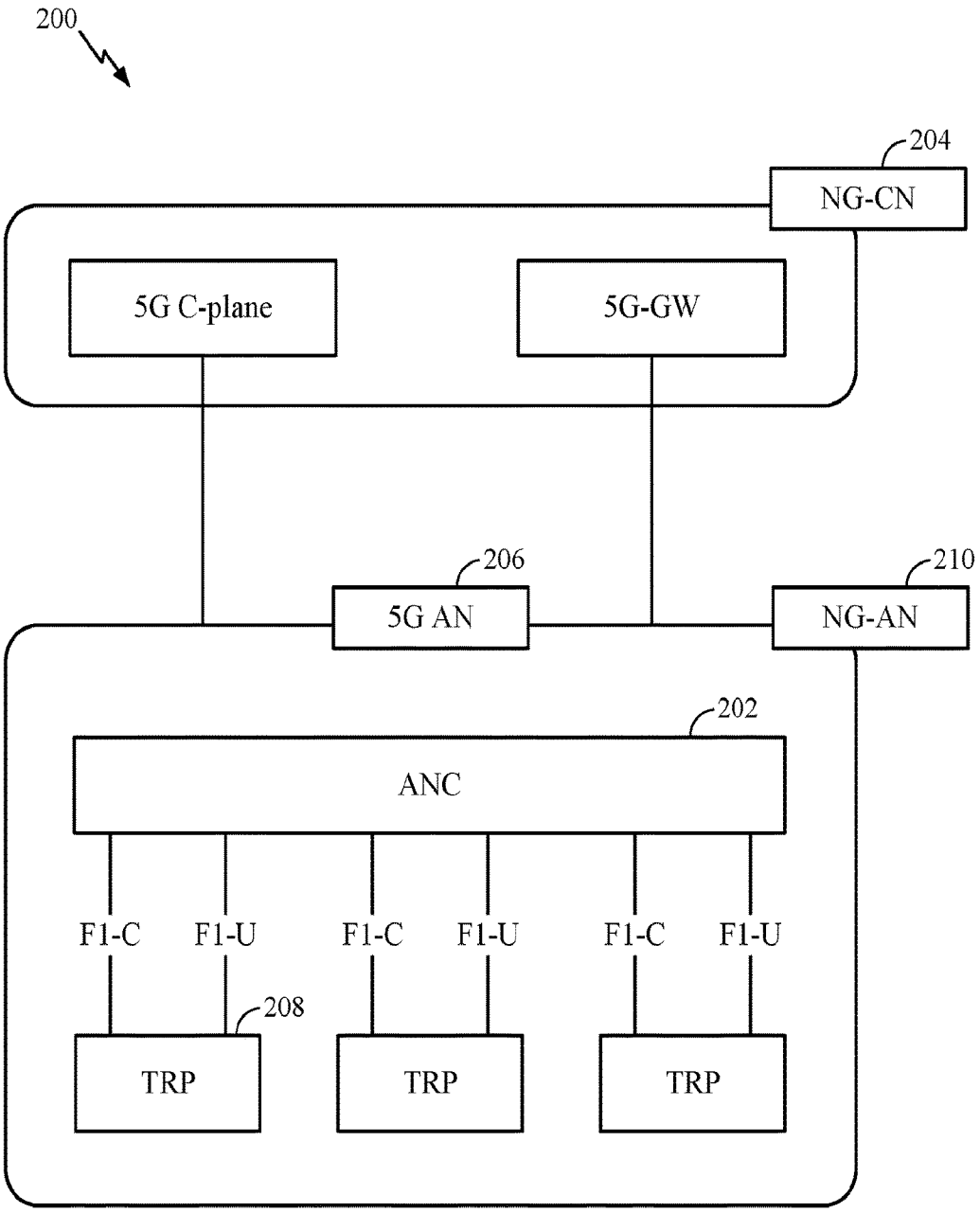
FIG. 2 is a block diagram illustrating an example logical architecture of a distributed radio access network (RAN), in accordance with certain aspects of the present disclosure.

FIG. 2 illustrates an example logical architecture of a distributed Radio Access Network (RAN) 200, which may be implemented in the wireless communication network 100 illustrated in FIG. 1. A 5G access node 206 may include an ANC 202. ANC 202 may be a central unit (CU) of the distributed RAN 200. The backhaul interface to the Next Generation Core Network (NG-CN) 204 may terminate at ANC 202. The backhaul interface to neighboring next generation access Nodes (NG-ANs) 210 may terminate at ANC 202. ANC 202 may include one or more TRPs 208 (e.g., cells, BSs, gNBs, etc.).

The TRPs 208 may be a distributed unit (DU). TRPs 208 may be connected to a single ANC (e.g., ANC 202) or more than one ANC (not illustrated). For example, for RAN sharing, radio as a service (RaaS), and service specific AND deployments, TRPs 208 may be connected to more than one ANC. TRPs 208 may each include one or more antenna ports. TRPs 208 may be configured to individually (e.g., dynamic selection) or jointly (e.g., joint transmission) serve traffic to a UE.

The logical architecture of distributed RAN 200 may support fronthauling solutions across different deployment types. For example, the logical architecture may be based on transmit network capabilities (e.g., bandwidth, latency, and/or jitter).

The logical architecture of distributed RAN 200 may share features and/or components with LTE. For example, next generation access node (NG-AN) 210 may support dual connectivity with NR and may share a common fronthaul for LTE and NR.

The logical architecture of distributed RAN 200 may enable cooperation between and among TRPs 208, for example, within a TRP and/or across TRPs via ANC 202. An inter-TRP interface may not be used.

Logical functions may be dynamically distributed in the logical architecture of distributed RAN 200. As will be described in more detail with reference to FIG. 5, the Radio Resource Control (RRC) layer, Packet Data Convergence Protocol (PDCP) layer, Radio Link Control (RLC) layer, Medium Access Control (MAC) layer, and a Physical (PHY) layers may be adaptably placed at the DU (e.g., TRP 208) or CU (e.g., ANC 202).

Figure 3:
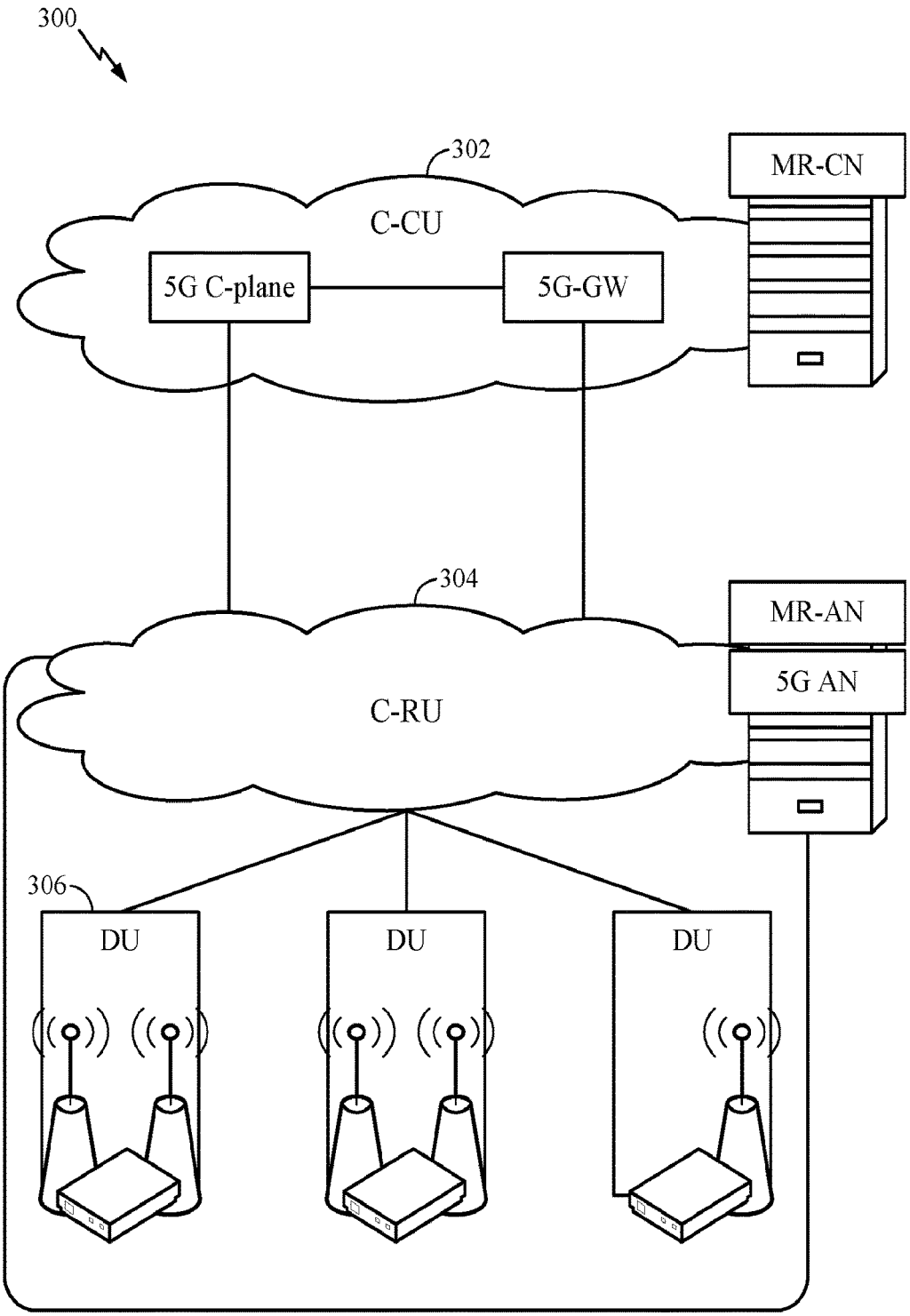
FIG. 3 is a diagram illustrating an example physical architecture of a distributed RAN, in accordance with certain aspects of the present disclosure.

FIG. 3 illustrates an example physical architecture of a distributed RAN 300, according to aspects of the present disclosure. A centralized core network unit (C-CU) 302 may host core network functions. C-CU 302 may be centrally deployed. C-CU 302 functionality may be offloaded (e.g., to advanced wireless services (AWS)), in an effort to handle peak capacity.

A centralized RAN unit (C-RU) 304 may host one or more ANC functions. Optionally, the C-RU 304 may host core network functions locally. The C-RU 304 may have distributed deployment. The C-RU 304 may be close to the network edge.

A DU 306 may host one or more TRPs (Edge Node (EN), an Edge Unit (EU), a Radio Head (RH), a Smart Radio Head (SRH), or the like). The DU may be located at edges of the network with radio frequency (RF) functionality.

Figure 4:
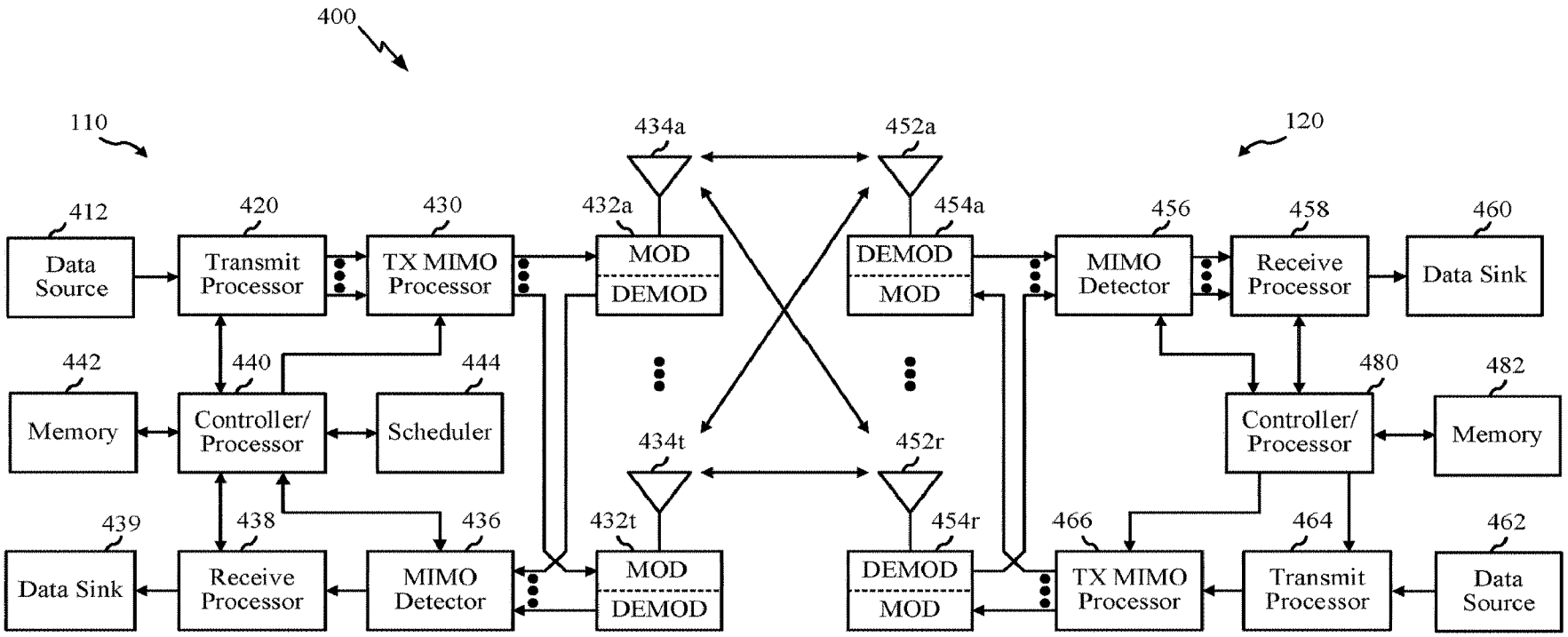
FIG. 4 is a block diagram conceptually illustrating a design of an example base station (BS) and user equipment (UE), in accordance with certain aspects of the present disclosure.

FIG. 4 illustrates example components of BS 110 and UE 120 (as depicted in FIG. 1), which may be used to implement aspects of the present disclosure. For example, antennas 452, processors 466, 458, 464, and/or controller/processor 480 of the UE 120 and/or antennas 434, processors 420, 460, 438, and/or controller/processor 440 of the BS 110 may be used to perform the various techniques and methods described herein for LDPC coding using LPDC codes having pairwise row orthogonality of adjacent rows in the PCM describing the code. For example, the processors 466, 458, 464, and/or controller/processor 480 of the UE 120 and/or the processors 420, 460, 438, and/or controller/processor 440 of the BS 110 may include an encoder and/or a decoder as described in more detail below with respect to FIG. 9 and FIG. 10, and may be configured to LDPC coding using LPDC code with pairwise row orthogonality in adjacent rows of the corresponding PCM describing the LDPC code, according to certain aspects of the present disclosure.

At the BS 110, a transmit processor 420 may receive data from a data source 412 and control information from a controller/processor 440. The control information may be for the physical broadcast channel (PBCH), physical control format indicator channel (PCFICH), physical hybrid ARQ indicator channel (PHICH), physical downlink control channel (PDCCH), group common PDCCH (GC PDCCH), etc. The data may be for the physical downlink shared channel (PDSCH), etc. The processor 420 may process (e.g., encode and symbol map) the data and control information to obtain data symbols and control symbols, respectively. The processor 420 may also generate reference symbols, e.g., for the primary synchronization signal (PSS), secondary synchronization signal (SSS), and cell-specific reference signal (CRS). A transmit (TX) multiple-input multiple-output (MIMO) processor 430 may perform spatial processing (e.g., precoding) on the data symbols, the control symbols, and/or the reference symbols, if applicable, and may provide output symbol streams to the modulators (MODs) 432a through 432t. Each modulator 432 may process a respective output symbol stream (e.g., for OFDM, etc.) to obtain an output sample stream. Each modulator may further process (e.g., convert to analog, amplify, filter, and upconvert) the output sample stream to obtain a downlink signal. Downlink signals from modulators 432a through 432t may be transmitted via the antennas 434a through 434t, respectively.

At the UE 120, the antennas 452a through 452r may receive the downlink signals from the base station 110 and may provide received signals to the demodulators (DEMODs) in transceivers 454a through 454r, respectively. Each demodulator 454 may condition (e.g., filter, amplify, downconvert, and digitize) a respective received signal to obtain input samples. Each demodulator may further process the input samples (e.g., for OFDM, etc.) to obtain received symbols. A MIMO detector 456 may obtain received symbols from all the demodulators 454a through 454r, perform MIMO detection on the received symbols if applicable, and provide detected symbols. A receive processor 458 may process (e.g., demodulate, deinterleave, and decode) the detected symbols, provide decoded data for the UE 120 to a data sink 460, and provide decoded control information to a controller/processor 480.

On the uplink, at UE 120, a transmit processor 464 may receive and process data (e.g., for the physical uplink shared channel (PUSCH)) from a data source 462 and control information (e.g., for the physical uplink control channel (PUCCH) from the controller/processor 480. The transmit processor 464 may also generate reference symbols for a reference signal (e.g., for the sounding reference signal (SRS)). The symbols from the transmit processor 464 may be precoded by a TX MIMO processor 466 if applicable, further processed by the demodulators in transceivers 454a through 454r (e.g., for SC-FDM, etc.), and transmitted to the base station 110. At the BS 110, the uplink signals from the UE 120 may be received by the antennas 434, processed by the modulators 432, detected by a MIMO detector 436 if applicable, and further processed by a receive processor 438 to obtain decoded data and control information sent by the UE 120. The receive processor 438 may provide the decoded data to a data sink 439 and the decoded control information to the controller/processor 440.

The controllers/processors 440 and 480 may direct the operation at the BS 110 and the UE 120, respectively. The processor 440 and/or other processors and modules at the BS 110 may perform or direct the execution of processes for the techniques described herein. The memories 442 and 482 may store data and program codes for BS 110 and UE 120, respectively. A scheduler 444 may schedule UEs for data transmission on the downlink and/or uplink.

Figure 5:
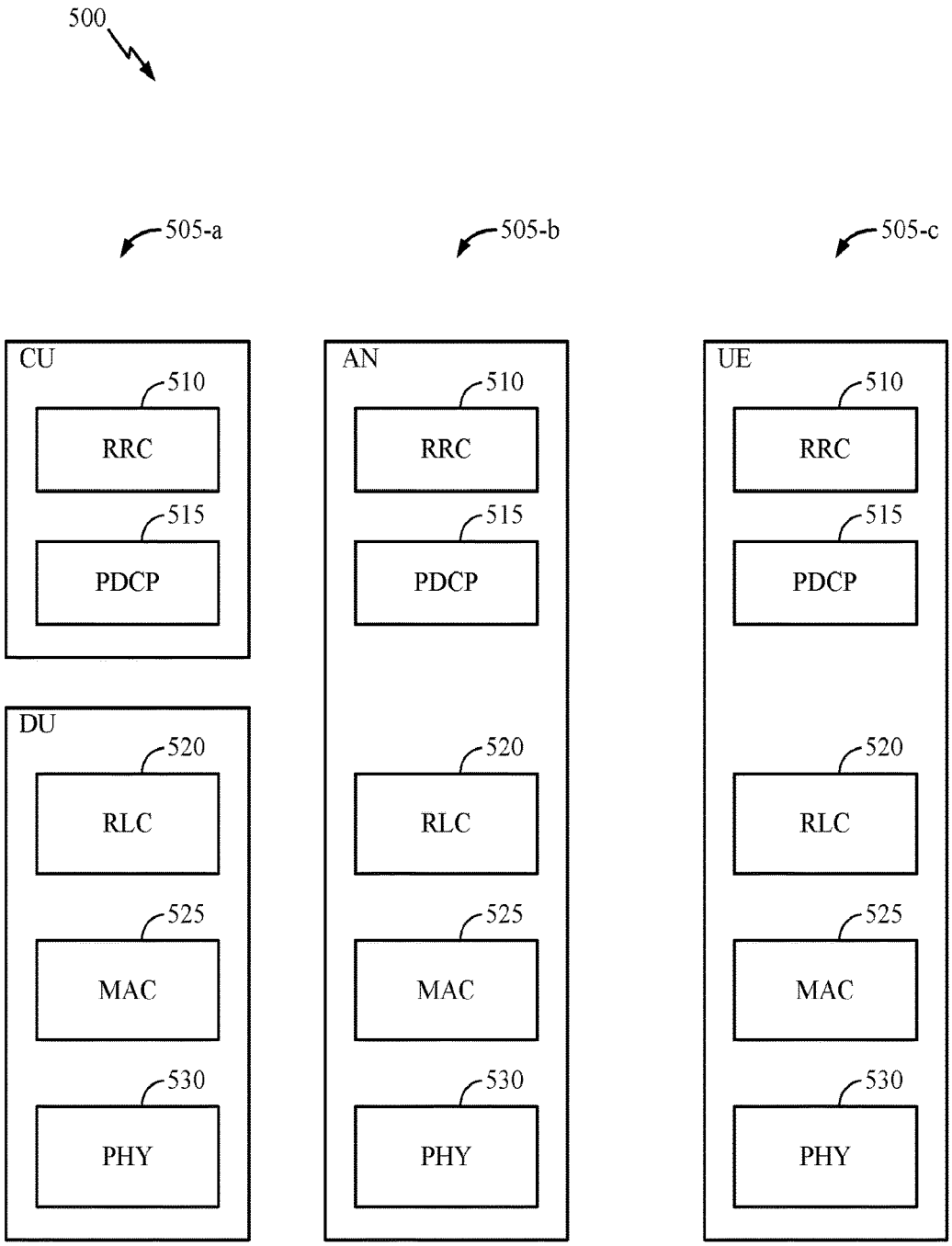
FIG. 5 is a diagram showing examples for implementing a communication protocol stack, in accordance with certain aspects of the present disclosure.

FIG. 5 illustrates a diagram 500 showing examples for implementing a communications protocol stack, according to aspects of the present disclosure. The illustrated communications protocol stacks may be implemented by devices operating in a wireless communication system, such as a 5G system (e.g., a system that supports uplink-based mobility). Diagram 500 illustrates a communications protocol stack including a RRC layer 510, a PDCP layer 515, a RLC layer 520, a MAC layer 525, and a PHY layer 530. In various examples, the layers of a protocol stack may be implemented as separate modules of software, portions of a processor or ASIC, portions of non-collocated devices connected by a communications link, or various combinations thereof. Collocated and non-collocated implementations may be used, for example, in a protocol stack for a network access device (e.g., ANs, CUs, and/or DUs) or a UE.

A first option 505-a shows a split implementation of a protocol stack, in which implementation of the protocol stack is split between a centralized network access device (e.g., an ANC 202 in FIG. 2) and distributed network access device (e.g., DU 208 in FIG. 2). In the first option 505-a, an RRC layer 510 and a PDCP layer 515 may be implemented by the central unit, and an RLC layer 520, a MAC layer 525, and a PHY layer 530 may be implemented by the DU. In various examples the CU and the DU may be collocated or non-collocated. The first option 505-a may be useful in a macro cell, micro cell, or pico cell deployment.

A second option 505-b shows a unified implementation of a protocol stack, in which the protocol stack is implemented in a single network access device. In the second option, RRC layer 510, PDCP layer 515, RLC layer 520. MAC layer 525, and PHY layer 530 may each be implemented by the AN. The second option 505-b may be useful in, for example, a femto cell deployment.

Regardless of whether a network access device implements part or all of a protocol stack, a UE may implement an entire protocol stack as shown in 505-c (e.g., the RRC layer 510, the PDCP layer 515, the RLC layer 520, the MAC layer 525, and the PHY layer 530).

In LTE, the basic transmission time interval (TTI) or packet duration is the 1 ms subframe. In NR, a subframe is still 1 ms, but the basic TTI is referred to as a slot. A subframe contains a variable number of slots (e.g., 1, 2, 4, 8, 16, . . . slots) depending on the subcarrier spacing. The NR RB is 12 consecutive frequency subcarriers. NR may support a base subcarrier spacing of 15 KHz and other subcarrier spacing may be defined with respect to the base subcarrier spacing, for example, 30 kHz, 60 kHz, 120 kHz, 240 kHz, etc. The symbol and slot lengths scale with the subcarrier spacing. The CP length also depends on the subcarrier spacing.

Figure 6:
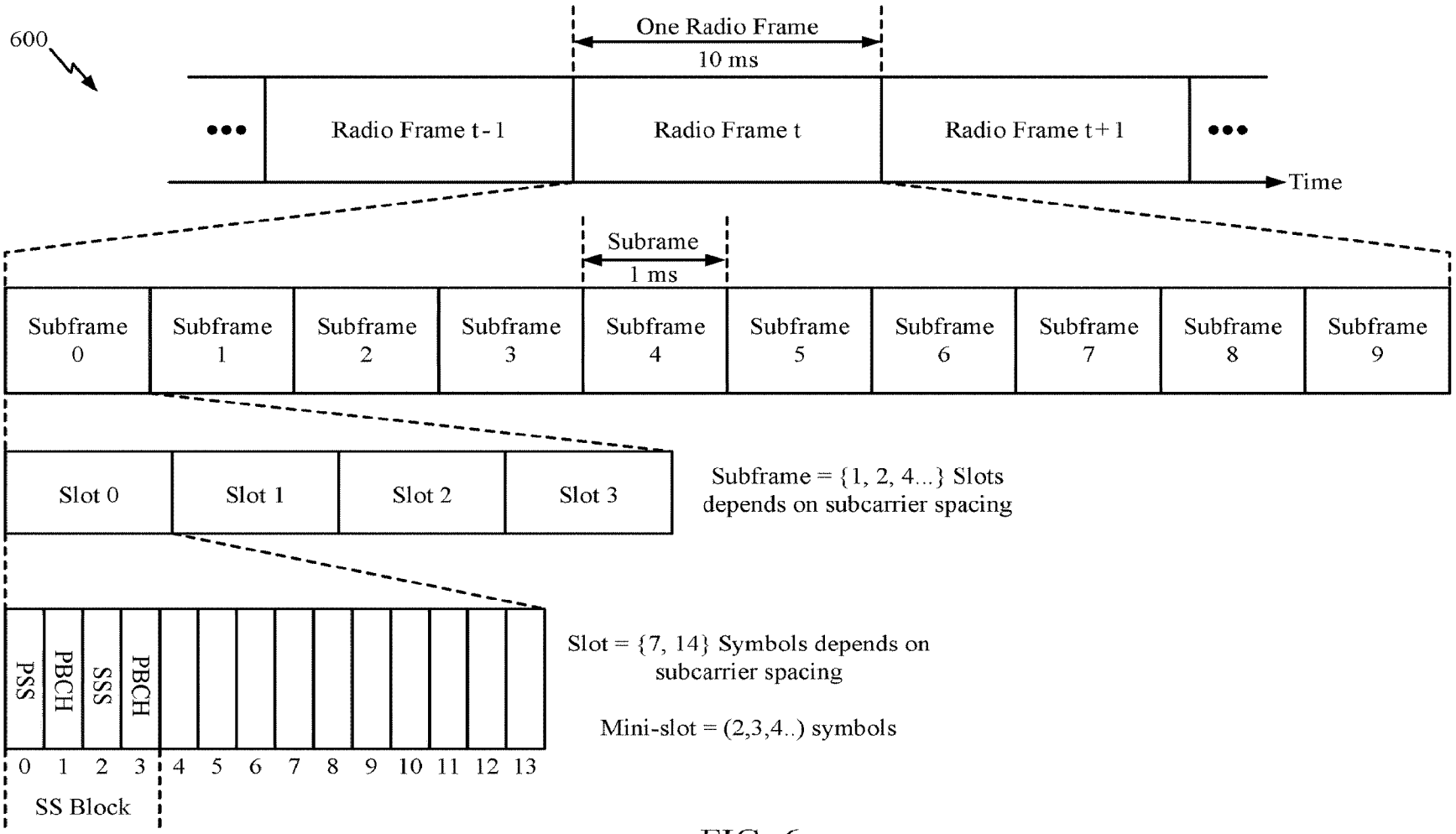
FIG. 6 illustrates an example of a frame format for a new radio (NR) system, in accordance with certain aspects of the present disclosure.

FIG. 6 is a diagram showing an example of a frame format 600 for NR. The transmission timeline for each of the downlink and uplink may be partitioned into units of radio frames. Each radio frame may have a predetermined duration (e.g., 10 ms) and may be partitioned into 10 subframes, each of 1 ms, with indices of 0 through 9. Each subframe may include a variable number of slots depending on the subcarrier spacing. Each slot may include a variable number of symbol periods (e.g., 7 or 14 symbols) depending on the subcarrier spacing. The symbol periods in each slot may be assigned indices. A mini-slot is a subslot structure (e.g., 2, 3, or 4 symbols).

Each symbol in a slot may indicate a link direction (e.g., DL, UL, or flexible) for data transmission and the link direction for each subframe may be dynamically switched. The link directions may be based on the slot format. Each slot may include DL/UL data as well as DL/UL control information.

In NR, a synchronization signal (SS) block is transmitted. The SS block includes a PSS, a SSS, and a two symbol PBCH. The SS block can be transmitted in a fixed slot location, such as the symbols 0-3 as shown in FIG. 6. The PSS and SSS may be used by UEs for cell search and acquisition. The PSS may provide half-frame timing, the SS may provide the CP length and frame timing. The PSS and SSS may provide the cell identity. The PBCH carries some basic system information (SI), such as downlink system bandwidth, timing information within radio frame, SS burst set periodicity, system frame number, etc. The SS blocks may be organized into SS bursts to support beam sweeping. Further system information such as, remaining minimum system information (RMSI), system information blocks (SIBs), other system information (OSI) can be transmitted on a PDSCH in certain subframes.

In some circumstances, two or more subordinate entities (e.g., UEs) may communicate with each other using sidelink signals. Real-world applications of such sidelink communications may include public safety, proximity services, UE-to-network relaying, vehicle-to-vehicle (V2V) communications, Internet of Everything (IoE) communications, IoT communications, mission-critical mesh, and/or various other suitable applications. Generally, a sidelink signal may refer to a signal communicated from one subordinate entity (e.g., UE1) to another subordinate entity (e.g., UE2) without relaying that communication through the scheduling entity (e.g., UE or BS), even though the scheduling entity may be utilized for scheduling and/or control purposes. In some examples, the sidelink signals may be communicated using a licensed spectrum (unlike wireless local area networks, which typically use an unlicensed spectrum).

A UE may operate in various radio resource configurations, including a configuration associated with transmitting pilots using a dedicated set of resources (e.g., a radio resource control (RRC) dedicated state, etc.) or a configuration associated with transmitting pilots using a common set of resources (e.g., an RRC common state, etc.). When operating in the RRC dedicated state, the UE may select a dedicated set of resources for transmitting a pilot signal to a network. When operating in the RRC common state, the UE may select a common set of resources for transmitting a pilot signal to the network. In either case, a pilot signal transmitted by the UE may be received by one or more network access devices, such as an AN, or a DU, or portions thereof. Each receiving network access device may be configured to receive and measure pilot signals transmitted on the common set of resources, and also receive and measure pilot signals transmitted on dedicated sets of resources allocated to the UEs for which the network access device is a member of a monitoring set of network access devices for the UE. One or more of the receiving network access devices, or a CU to which receiving network access device(s) transmit the measurements of the pilot signals, may use the measurements to identify serving cells for the UEs, or to initiate a change of serving cell for one or more of the UEs.

Example Error Correction Coding

Many communications systems (e.g., such as NR) use error-correcting codes. Error correcting codes generally compensate for the intrinsic unreliability of information transfer (e.g., over the air medium) in these systems by introducing redundancy into the data stream. Low-density parity-check (LDPC) codes are one type of error correcting codes which use an iterative coding system. Gallager codes are an example of "regular" LDPC codes. Regular LDPC codes are linear block code in which most of the elements of its parity check matrix H (PCM) are '0'.

LDPC codes can be represented by bipartite graphs (often referred to as "Tanner graphs"). In a bipartite graph, a set of variable nodes corresponds to bits of a codeword (e.g., information bits or systematic bits), and a set of check nodes correspond to a set of parity-check constraints that define the code. Edges in the graph connect variable nodes to check nodes. Thus, the nodes of the graph are separated into two distinctive sets and with edges connecting nodes of two different types, variable and check.

Graphs as used in LDPC coding may be characterized in a variety of manners. A lifted code is created by copying a bipartite base graph (G) a number of times, N. The number of copies, or liftings, may be referred to as the lifting size or lifting size value Z. A variable node and a check node are considered "neighbors" if they are connected by an "edge" (i.e., the line connecting the variable node and the check node) in the bipartite graph. For each edge (e) of the bipartite base graph, a permutation is applied to the N copies of edge (e) to interconnect the N copies of G. A bit sequence having a one-to-one association with the variable node sequence is a valid codeword if and only if, for each check node (also referred to as a constraint node), the bits associated with all neighboring variable nodes sum to 0 modulo 2, i.e., they include an even number of 1's. The resulting LDPC code may be quasi-cyclic (QC) if the permutations used are cyclic. The cyclic permutations applies to the edges may be referred to as lifting values or cyclic lifting values. The lifting values are represented by a value k of an entry in the PCM.

Figures 7, 7A:
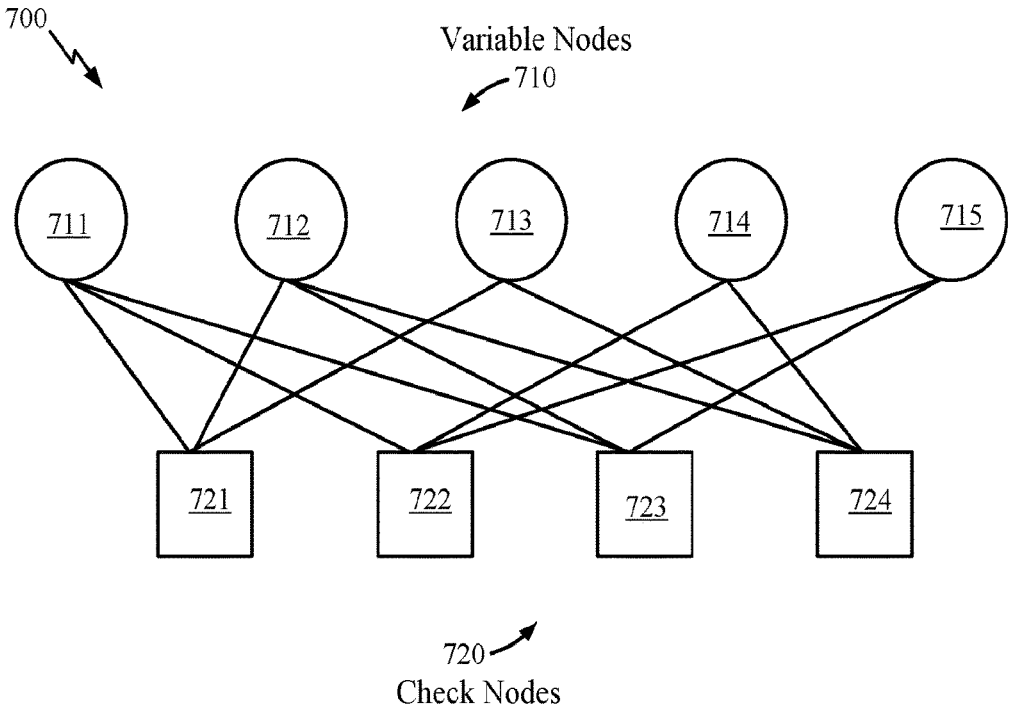
FIGS. 7-7A show graphical and matrix representations of an exemplary low-density parity-check (LDPC) code, in accordance with certain aspects of the present disclosure.

FIGS. 7-7A show graphical and matrix representations of an exemplary LDPC code, respectively, in accordance with certain aspects of the present disclosure. FIG. 7 shows a bipartite graph 700 representing an example LDPC code. The bipartite graph 700 includes a set of five variable nodes 710 (represented by circles) connected to four check nodes 720 (represented by squares). Edges in the graph 700 connect variable nodes 710 to the check nodes 720 (represented by the lines connecting the variable nodes 710 to the check nodes 720). The bipartite graph 700 consists of $|V|=5$ variable nodes and $|C|=4$ check nodes, connected by $|E|=12$ edges.

The bipartite graph 700 may be represented by a simplified adjacency matrix. FIG. 7A shows a matrix representation 700A of the bipartite graph 700. The matrix representation 700A includes the PCM, H, and a codeword vector x, where $x_1, x_2, \ldots x_5$ represent bits of the codeword x. H is used for determining whether a received signal was normally decoded. H is a binary matrix having C rows corresponding to j check nodes and V columns corresponding to i variable nodes (i.e., a demodulated symbol). The rows represent the equations and the columns represent the bits (also referred to as digits) of the codeword. In FIG. 7A, H has four rows and five columns corresponding to the four check nodes and the five variable nodes, respectively. If a j-th check node is connected to an i-th variable node by an edge, i.e., the two nodes are neighbors and the edge is represented by a 1 in the i-th column and j-th row of H. That is, the intersection of an i-th row and a j-th column contains a "1" where an edge joins the corresponding vertices and a "0" where there is no edge. In some representations, a blank or a (*) is used to represent no edge. The codeword vector x represents a valid codeword if and only if $H_x=0$. Thus, if the codeword is received correctly, then $H_x=0$ (mod 2). When the product of a coded received signal and the PCM becomes "0", this signifies that no error has occurred.

The length of the LDPC code corresponds to the number of variable nodes in the bipartite graph. The number of edges (e.g., non-zero elements, also referred to as entries, in the PCM) in a row (column) is defined as the row (column) weight $d_c(d_v)$. The degree of a node refers to the number of edges connected to that node. For example, as shown in FIG. 7, the variable node 711 has three degrees of connectivity, with edges connected to check nodes 721, 722, and 723. Variable node 712 has three degrees of connectivity, with edges connected to check nodes 721, 723, and 724. Variable node 713 has two degrees of connectivity, with edges connected to check nodes 721 and 724. Variable node 714 has two degrees of connectivity, with edges connected to check nodes 722 and 724. And variable node 715 has two degrees of connectivity, with edges connected to check nodes 722 and 723.

In the bipartite graph 700 shown in FIG. 7, the number of edges incident to a variable node 710 is equal to the number of 1's in the corresponding column in the PCM H shown in FIG. 7A, and is called the variable node degree d(v). Similarly, the number of edges connected with a check node 420 is equal to the number of ones in a corresponding row and is called the check node degree d(c). For example, as shown in FIG. 7A, the first column in the matrix H corresponds to the variable node 711 and the corresponding entries in the column (1, 1, 1, 0) indicates the edge connections to the check nodes 721, 722, and 723. while the 0 indicates that there is not an edge to check node 724. The entries in the second, third, fourth, and fourth columns of H represent the edge connections of the variable nodes 712, 713, 714, and 715, respectively, to the check nodes. A regular code is one for which all variable nodes in the bipartite graph have the same degree and all constraint nodes have the same degree. On the other hand, an irregular code has constraint nodes and/or variable nodes of differing degrees.

Figure 8:
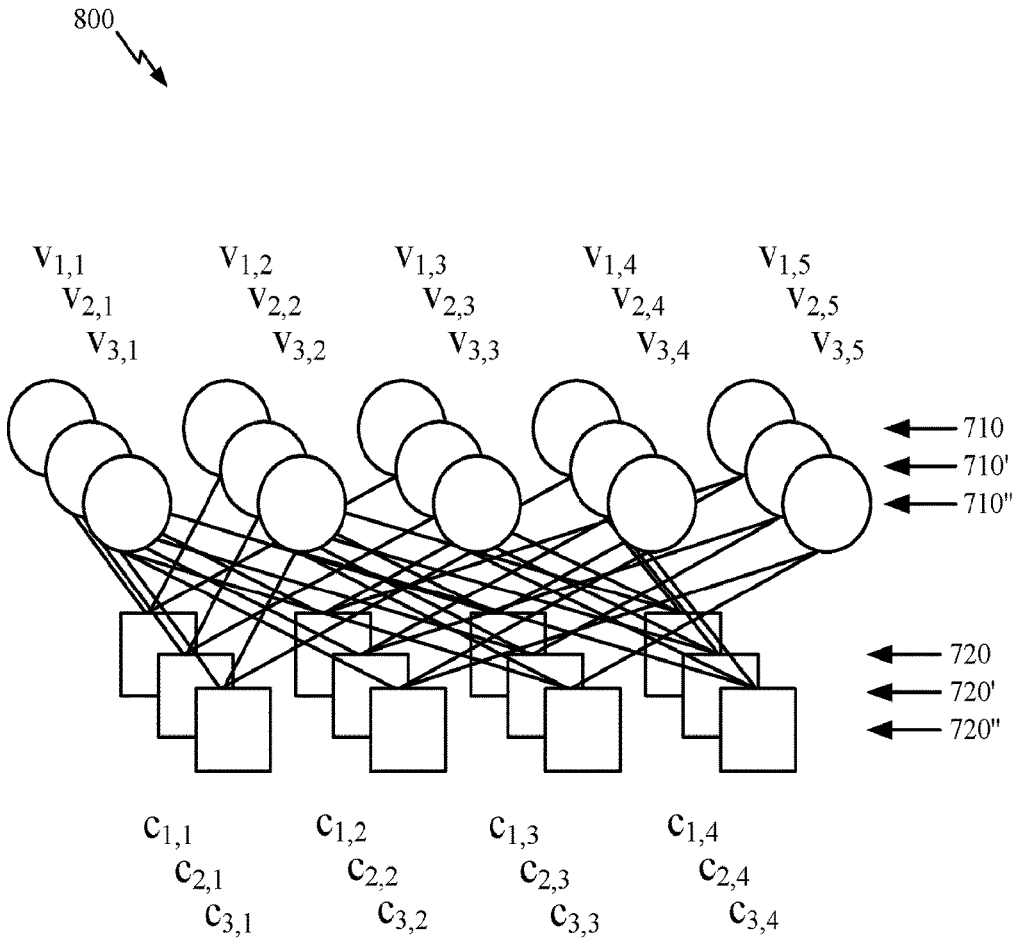
FIG. 8 is a lifted bipartite graph illustrating lifting of the LDPC code of FIG. 7A, in accordance with certain aspects of the present disclosure.

"Lifting" enables LDPC codes to be implemented using parallel encoding and/or decoding implementations while also reducing the complexity typically associated with large LDPC codes. Lifting helps enable efficient parallelization of LDPC decoders while still having a relatively compact description. More specifically, lifting is a technique for generating a relatively large LDPC code from multiple copies of a smaller base code. For example, a lifted LDPC code may be generated by producing Z parallel copies of the base graph (e.g., protograph) and then interconnecting the parallel copies through permutations of edge clusters of each copy of the base graph. The base graph defines the (macro) structure of the code and consists of a number (K) of information bit columns and a number (N) of code bit columns. Z liftings of the base graph results in a final blocklength of KZ. Thus, a larger graph can be obtained by a "copy and permute" operation where multiple copies of the base graph are made and connected to form a single lifted graph. For the multiple copies, like edges are a set of copies of single base edge, are permutated and connected to form a connected graph Z times larger than the base graph. FIG. 8 is a lifted bipartite graph 900 illustrating liftings of three copies of the bipartite graph 700 of FIG. 7. Three copies may be interconnected by permuting like edges among the copies. If the permutations are restricted to cyclic permutations, then the resulting bipartite graph 900 corresponds to a quasi-cyclic LDPC with lifting Z=3.

A corresponding PCM of the lifted graph can be constructed from the PCM of the base graph (also known as the "base PCM") by replacing each entry in the base PCM with a Z×Z matrix. The "0" (or blank or (*)) entries (those having no base edges) are replaced with the 0 matrix and the non-zero entries (indicating a base edge) are replaced with a Z×Z permutation matrix. In the case of cyclic liftings, the permutations are cyclic permutations.

A cyclically lifted LDPC code can also be interpreted as a code over the ring of binary polynomials modulo $x^z+1$. In this interpretation, a binary polynomial, $(x)=b_0+b_1x+b_2x^2+\ldots b_{z-1}x^{z-1}$ may be associated to each variable node in the base graph. The binary vector $(b_0, b_1, b_2, \ldots, b_{z-1})$ corresponds to the bits associated to Z corresponding variable nodes in the lifted graph, that is, Z copies of a single base variable node. A cyclic permutation by k of the binary vector is achieved by multiplying the corresponding binary polynomial by $x^k$ where multiplication is taken modulo $x^z+1$. A degree d parity check in the base graph can be interpreted as a linear constraint on the neighboring binary polynomials $B_1(x), \ldots, B_d(x)$, written as $x^{k_1}B_1(x)+x^{k_2}B_2(x)+\ldots+x^{k_d}B_d(x)=0x^{k_1}B_1(x)+x^{k_2}B_2(x)+\ldots+x^{k_d}B_d(x)=0$, the values, $k_1, \ldots, k_d$ are the cyclic lifting values associated to the corresponding edges. This resulting equation is equivalent to the Z parity checks in the cyclically lifted Tanner graph corresponding to the single associated parity check in the base graph. Thus, the PCM for the lifted graph can be expressed using the matrix for the base graph in which "1" entries are replaced with monomials of the form $x^k$ and "0" entries are lifted as 0, but now the 0 is interpreted as the 0 binary polynomial modulo $x^z+1$. Such a matrix may be written by giving the value kin place of $x^k$. In this case the 0 polynomial is sometimes represented as "−1" and sometimes as another character in order to distinguish it from $x^0$.

Typically, a square submatrix of the PCM represents the parity bits of the code. The complementary columns correspond to information bits that, at the time of encoding, are set equal to the information bits to be encoded. The encoding may be achieved by solving for the variables in the aforementioned square submatrix in order to satisfy the parity check equations. The PCM may be partitioned into two parts M and N, where M is the square portion. Thus, encoding reduces to solving $M_c=s=Nd$ where c and d comprise x. In the case of quasi-cyclic codes, or cyclically lifted codes, the above algebra can be interpreted as being over the ring of binary polynomials modulo $x^z+1$.

A received LDPC codeword can be decoded to produce a reconstructed version of the original codeword. In the absence of errors, or in the case of correctable errors, decoding can be used to recover the original data unit that was encoded. Redundant bits may be used by decoders to detect and correct bit errors. LDPC decoder(s) generally operate by iteratively performing local calculations and passing those results by exchanging messages within the bipartite graph along the edges, and updating these messages by performing computations at the nodes based on the incoming messages. These steps may be repeated several times. For example, each variable node 710 in the graph 700 may initially be provided with a "soft bit" (e.g., representing the received bit of the codeword) that indicates an estimate of the associated bit's value as determined by observations from the communications channel. Using these soft bits the LDPC decoders may update messages by iteratively reading them, or some portion thereof, from memory and writing an updated message, or some portion thereof, back to, memory. The update operations are typically based on the parity check constraints of the corresponding LDPC code. For lifted LDPC codes, messages on like edges are often processed in parallel.

LDPC codes designed for high speed applications often use quasi-cyclic constructions with large lifting factors and relatively small base graphs to support high parallelism in encoding and decoding operations. LDPC codes with higher code rates (e.g., the ratio of the message length to the code word length) tend to have relatively fewer parity checks. If the number of base parity checks is smaller than the degree of a variable node (e.g., the number of edges connected to a variable node), then, in the base graph, that variable node is connected to at least one of the base parity checks by two or more edges (e.g., the variable node may have a "double edge"). Or if the number of base parity checks is smaller than the degree of a variable node (e.g., the number of edges connected to a variable node), then, in the base graph, that variable node is connected to at least one of the base parity checks by two or more edges. Having a base variable node and a base check node connected by two or more edges is generally undesirable for parallel hardware implementation purposes. For example, such double edges may result in multiple concurrent read and write operations to the same memory locations, which in turn may create data coherency problems. A double edge in a base LDPC code may trigger parallel reading of the same soft bit value memory location twice during a single parallel parity check update. Thus, additional circuitry is typically needed to combine the soft hit values that are written hack to memory, so as to properly incorporate both updates. However, eliminating double edges in the LDPC code helps to avoid this extra complexity In the definition of standard irregular LDPC code ensembles (degree distributions) all edges in the Tanner graph representation may be statistically interchangeable. In other words, there exists a single statistical equivalence class of edges. For multi-edge LDPC codes, multiple equivalence classes of edges may be possible. While in the standard irregular LDPC ensemble definition, nodes in the graph (both variable and constraint) are specified by their degree, i.e., the number of edges they are connected to, in the multi-edge type setting an edge degree is a vector; it specifies the number of edges connected to the node from each edge equivalence class (type) independently. A multi-edge type ensemble is comprised of a finite number of edge types. The degree type of a constraint node is a vector of (non-negative) integers; the i-th entry of this vector records the number of sockets of the i-th type connected to such a node. This vector may be referred to as an edge degree. The degree type of a variable node has two parts although it can be viewed as a vector of (non-negative) integers. The first part relates to the received distribution and will be termed the received degree and the second part specifies the edge degree. The edge degree plays the same role as for constraint nodes. Edges are typed as they pair sockets of the same type. This constraint, that sockets must pair with sockets of like type, characterizes the multi-edge type concept. In a multi-edge type description, different node types can have different received distributions (e.g., the associated bits may go through different channels).

Puncturing is the act of removing bits from a codeword to yield a shorter codeword. Punctured variable nodes correspond to codeword bits that are not actually transmitted. Puncturing a variable node in an LDPC code creates a shortened code (e.g. due to the removal of a bit), while also effectively removing a check node. If the variable node to be punctured has a degree of one, puncturing the variable node removes the associated bit from the code and effectively removes its single neighboring check node from the graph. As a result, the number of check nodes in the graph is reduced by one.

Figure 9:
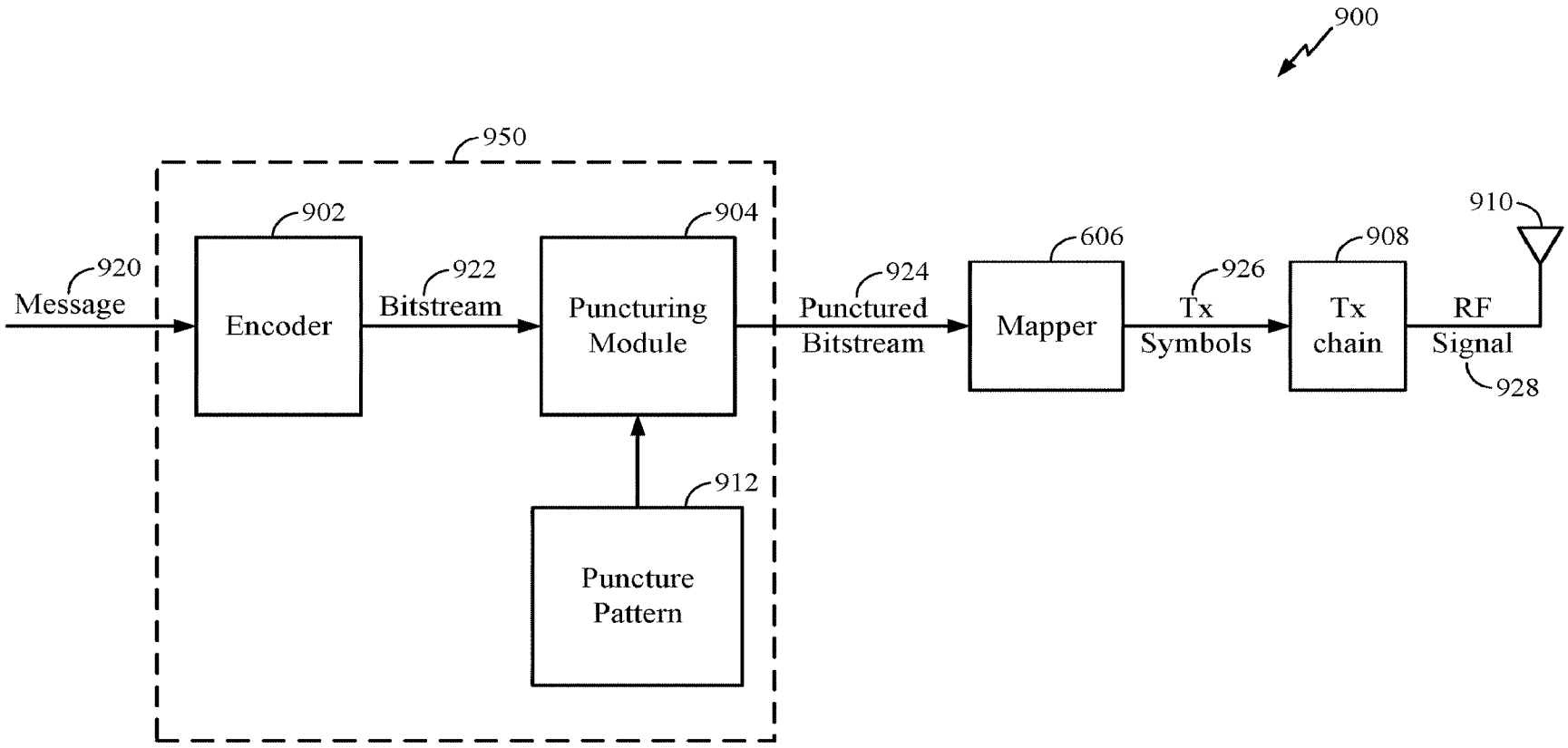
FIG. 9 is a block diagram illustrating an encoder, in accordance with certain aspects of the present disclosure.

FIG. 9 is a simplified block diagram illustrating an encoder, in accordance with certain aspects of the present disclosure. FIG. 9 is a simplified block diagram 900 illustrating a portion of a radio frequency (RF) modem 950 that may be configured to provide a signal including a punctured encoded message for wireless transmission. In one example, a convolutional encoder 902 in transmitting device, such as a BS (e.g., a BS 110) on the downlink or a UE (e.g., a UE 120) on the uplink, receives a message 920 for transmission. The message 920 may contain data and/or encoded voice or other content directed to a receiving device (e.g., a UE on the downlink or a BS on the uplink). The encoder 902 encodes the message. In some examples, the encoder 902 encodes information bits of the message using LDPC codes having pairwise row orthogonality, in accordance with certain aspects of the present disclosure described in more detail below. An encoded bit stream 922 produced by the encoder 902 may then be selectively punctured by a puncturing module 904, which may be a separate device or component, or which may be integrated with the encoder 902. The puncturing module 904 may determine that the bit stream should be punctured prior to transmission, or transmitted without puncturing. The decision to puncture the bit stream 922 is typically made based on network conditions, network configuration, radio access network (RAN) defined preferences, and/or for other reasons. The bit stream 922 may be punctured according to a puncture pattern 912 and used to encode the message 920. The puncturing module 904 provides an output 924 to a mapper 906 that generates a sequence of transmit (Tx) symbols 926 that are modulated, amplified, and otherwise processed by Tx chain 908 to produce an RF signal 928 for transmission through antenna 910. The punctured codeword bits are not transmitted.

The decoders and decoding algorithms used to decode LDPC codewords operate by exchanging messages within the graph along the edges and updating these messages by performing computations at the nodes based on the incoming messages. Each variable node in the graph is initially provided with a soft bit, termed a received value, that indicates an estimate of the associated bit's value as determined by observations from, for example, the communications channel. Ideally, the estimates for separate bits are statistically independent; however, this ideal may be violated in practice. A received codeword is comprised of a collection of received values.

Figure 10:
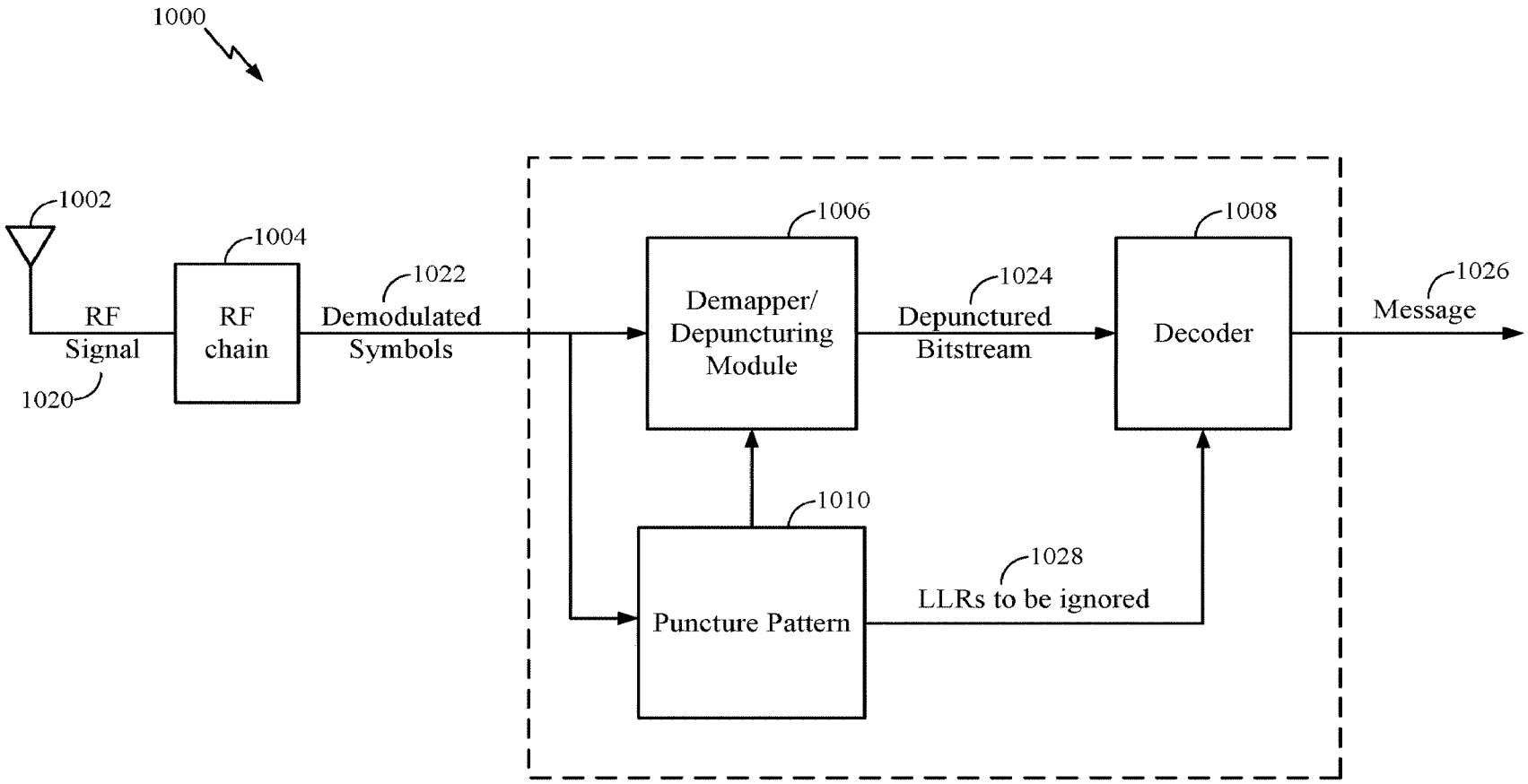
FIG. 10 is a block diagram illustrating a decoder, in accordance with certain aspects of the present disclosure.

FIG. 10 is a simplified block diagram illustrating a decoder, in accordance with certain aspects of the present disclosure. FIG. 10 is a simplified schematic 1000 illustrating a portion of a RF modem 1050 that may be configured to receive and decode a wirelessly transmitted signal including a punctured encoded message. The punctured codeword bits may be treated as erased. For example, the log likelihood ratios (LLRs) of the punctured nodes may be set to 0 at initialization. In various examples, the modem 1050 receiving the signal may reside in a receiving device, such as a UE (e.g., UE 120) on the downlink or a BS (e.g., BS 120) on the uplink. An antenna 1002 provides an RF signal 1020 to the receiving device. An RF chain 1004 processes and demodulates the RF signal 1020 and may provide a sequence of symbols 1022 to a demapper 1006, which produces a bit stream 1024 representative of the encoded message.

The demapper 1006 provides a depunctured bit stream 1024. In some examples, the demapper 1006 includes a depuncturing module that can be configured to insert null values at locations in the bit stream at which punctured bits were deleted by the transmitter. The depuncturing module may be used when the puncture pattern 1010 used to produce the punctured bit stream at the transmitter is known. The puncture pattern 1010 can be used to identify LLRs 1028 ignored during decoding of the bit stream 1024 by the decoder 1008. The LDPC decoder may include a plurality of processing elements to perform the parity check or variable node operations in parallel. For example, when processing a codeword with lifting size Z, the LDPC decoder may utilize Z processing elements to perform parity check operations on all Z edges of a lifted graph, concurrently.

In some examples, the decoder 1008 decodes information bits of the message based on LDPC codes having pairwise row orthogonality, in accordance with certain aspects of the present disclosure described in more detail below. In some example, the decoder 1008 is a new decoder that exploits the pairwise row orthogonality of the LDPC to perform flexible decoder scheduling without performance loss.

Example Pairwise Orthogonality of Adjacent Rows in LDPC Code

In new radio (NR), low-density parity-check (LDPC) is used for channel coding of certain channels. As described above with respect to FIGS. 7-10, LDPC codes are defined by the basegraph, including variable nodes and check nodes, and the basegraph can be represented by a corresponding parity check matrix (PCM) having columns corresponding to the variable nodes and rows corresponding to the check nodes. Edges in the basegraph have entries in the PCM. Quasi-cyclic LDPC codes have integer cyclic lifting values $V_{i,j}$ in the non-zero entries in the PCM for ith column and the jth row. The cyclic lifting values correspond to circulant permutations of the edges when the basegraph if lifted to obtain a lifted graph. The number of lifts, Z, is the lifting or lifting size value. Different values of Z for the basegraph are used to support different blocklengths. For each supported lift, the shift coefficients are calculated as a function of the lifting size and the cyclic lifting value as:

$$P_{i,j}=f(V_{i,j},Z)$$

Shortening can be applied before the LDPC encoding. Systematic bits may be punctured.

Aspects of the present disclosure provide LDPC encoders using LDPC codes having pairwise orthogonality of adjacent rows in the PCM describing the code and LDPC decoders that can exploit the LDPC coding with the pairwise row orthogonality to perform flexible decoder scheduling without performance loss.

Figure 11:
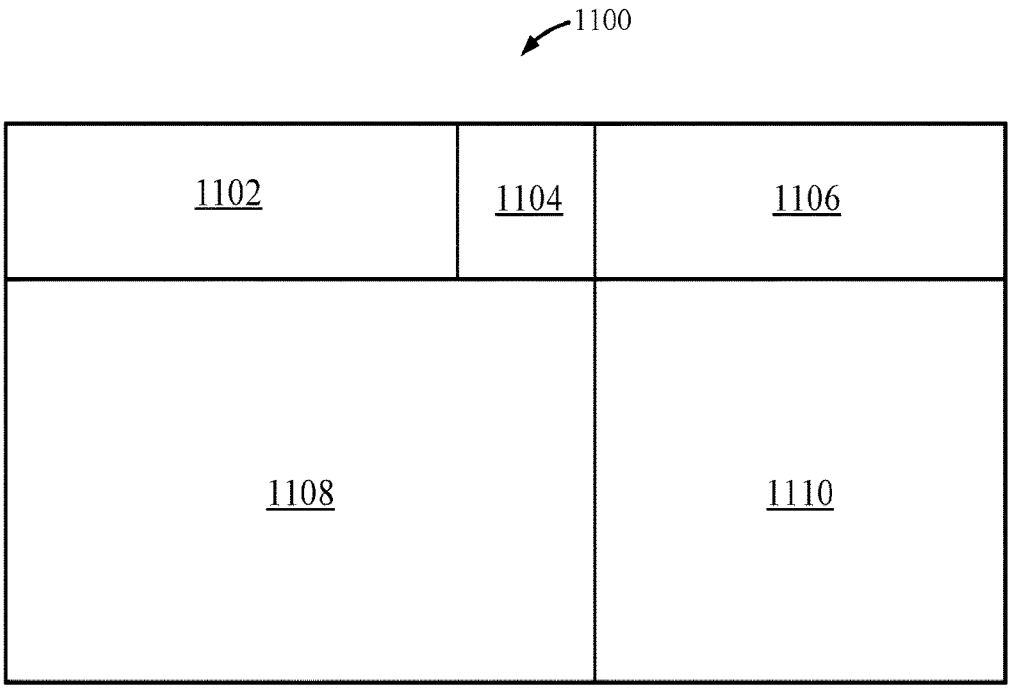
FIG. 11 is an example generalized structure of an LDPC code base matrix, in accordance with certain aspects of the present disclosure.

In NR, the PCM for some basegraphs used for LDPC coding have the PCM structure 1100 shown in FIG. 11. The PCM structure 1100 includes an upper portion with the region 1102 corresponding to systems bits; the region 1104 corresponding to parity bits; and the region 1106 corresponding to hybrid automatic repeat request (HARQ) extension bits (e.g., all zeros). The regions 1102 and 1106 may have a horizontally rectangular shape. In some examples, the first two, highest degree, systematic bits in the region 1102 may be punctured (e.g., the first two columns in the PCM). The region 1104 has a square shape. The region 1104 may include a special parity bit. The first or last column in the region 1104 may have a weight of 1, while the remaining columns may have a weight of 3 and dual diagonal.

The PCM structure 1100 also includes a lower portion with the region 1108 and the region 1110. In some examples, the lower portion of the PCM structure 1100 may be used for puncturing and/or incremental redundancy (IR) HARQ. The region 1110 may be a diagonal matrix (i.e., a diagonal of entries with the rest not having entries, i.e., zero). The lower diagonal structure may ensure that puncturing of the mother code does not require decoding of the mother code, thereby reducing complexity. The diagonal structure may render the code amenable to node-parallel decoding architectures. The columns of region 1110 may correspond to HARQ bits and the region 1108. According to certain aspects, the region 1108 (and also maybe a portion of the region 1110) in the lower power portion of the PCM structure 1100 may have pairwise row orthogonality in each adjacent row.

Figure 12:
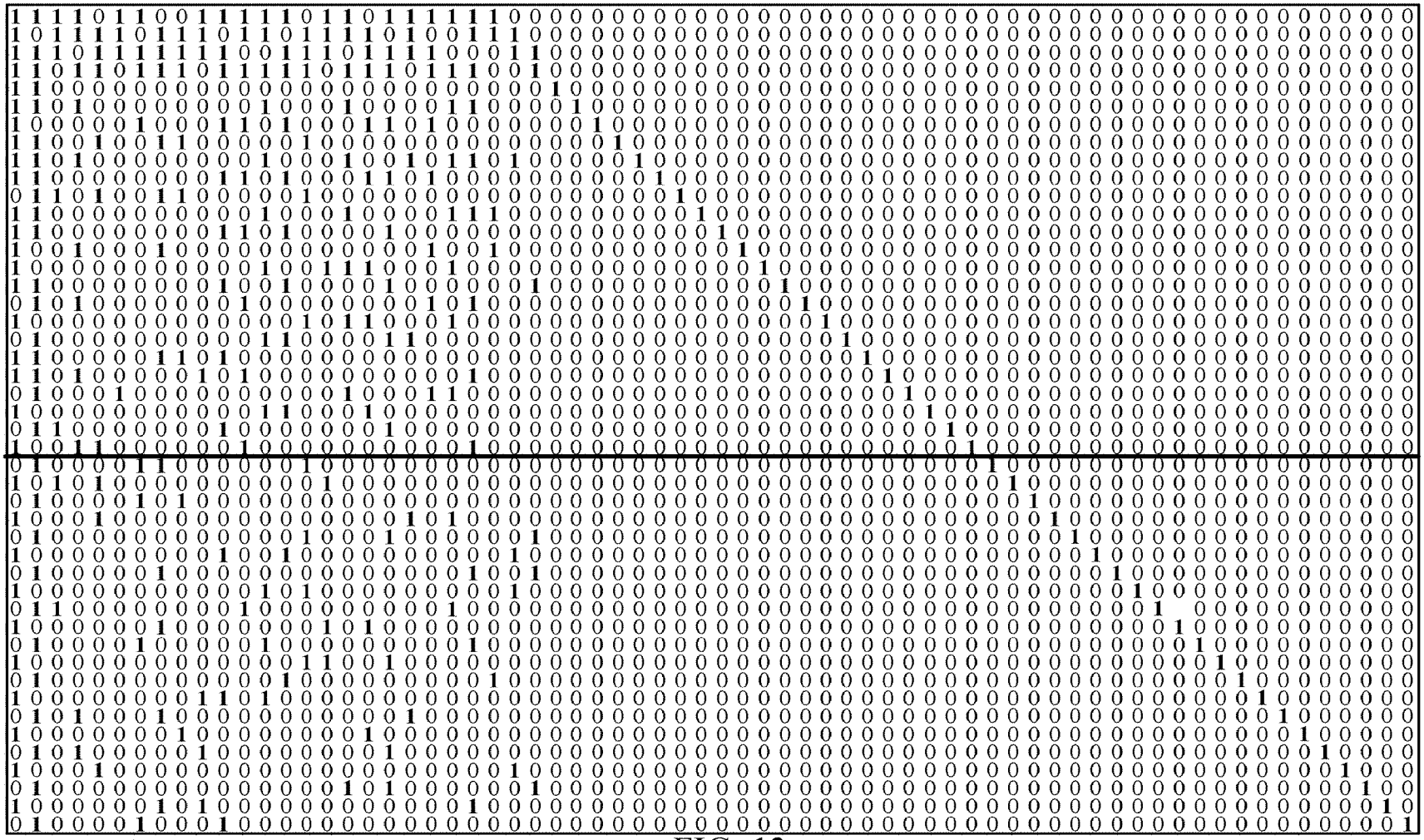
FIG. 12 an example LDPC code base matrix, in accordance with certain aspects of the present disclosure.

FIG. 12 an example PCM 1200 for an LDPC code, illustrating the PCM structure 1100 of FIG. 11, in accordance with certain aspects of the present disclosure. In the PCM 1200 shown in FIG. 12, a "1" represents an entry in the PCM (which may be replaced with a cyclic lifting value $V_{i,j}$) and a "0" represents absence of an entry. As shown in FIG. 12, the PCM 1200 includes a bottom portion with pairwise row orthogonality in adjacent rows. As shown, in the rows 26-46, in the columns (e.g., columns 1-22) before the bottom diagonal structure (e.g., corresponding to the region 1108 before the region 1110) and, in some cases, a first portion of the region 1110 (e.g., columns 23-27), in any given column there are not entries in adjacent (i.e., consecutive) rows. In other words, adjacent rows in the lower portion of the columns can both have no entries (i.e., shown as 0's) or only one has an entry (i.e., a 1,0 or 0,1), such that there entries are not in any pair of adjacent rows (i.e., 1,1 does not occur).

Although FIG. 12 illustrates an example PCM with the pairwise row orthogonality in the rows 26-46, the different numbers of rows could be non-orthogonal. In some examples, in the first portion of the rows of the lower structure (i.e., region 1108), the first two columns include some non-orthogonality of the rows, while in the remaining columns in the first portion are non-orthogonal. However, in the second portion of the rows in the lower structure, adjacent rows in all of the columns are orthogonal. For example, as shown in FIG. 12, in the rows 6-25 in a PCM (e.g., a first portion of the lower structure), adjacent rows in the first two columns (i.e., columns 102) are not always orthogonal, however, the adjacent rows in the remaining columns (i.e., columns 3-27) are pairwise orthogonal. As shown in FIG. 12, in the bottom portion of the lower structure, rows 26-46, all of the columns in the region (e.g., columns 1-27) have pairwise row orthogonality.

According to certain aspects, at least a portion of the description of the basegraph may be stored on chip, for example, at the BS and/or the UE. The description may be basegraph, the PCM, or some other representation of the sparse matrix.

To recover the information bits, the receiving decodes the codeword received from the transmitting device. The receiving device may decode according to decoding schedule. The receiving device may decode the codeword using a layered decoder. The decoding schedule may be based, at least in part, on the stored description of the basegraph. The decoding schedule may decode the codeword row by row (e.g., using the basegraph). The decoding schedule may decode the codeword column by column. The decoding schedule may decode the two columns at a time (e.g., within a row or pair of rows). The decoding schedule may skip absent entries for decoding.

In some examples, the receiving device may use a new decoder with improved performance. The decoder may exploit the pairwise orthogonality of the LDPC described herein to increase decoding speed, for example, by decoding the codeword by pairs of rows at a time, without performance loss. In addition, the decoder may have increased decoding scheduling flexibility, due to the pairwise row orthogonality, because for any set of three consecutive rows in the lower portion of the code, the decoder can select between two different orthogonal combinations for simultaneous decoding.

Figure 13:
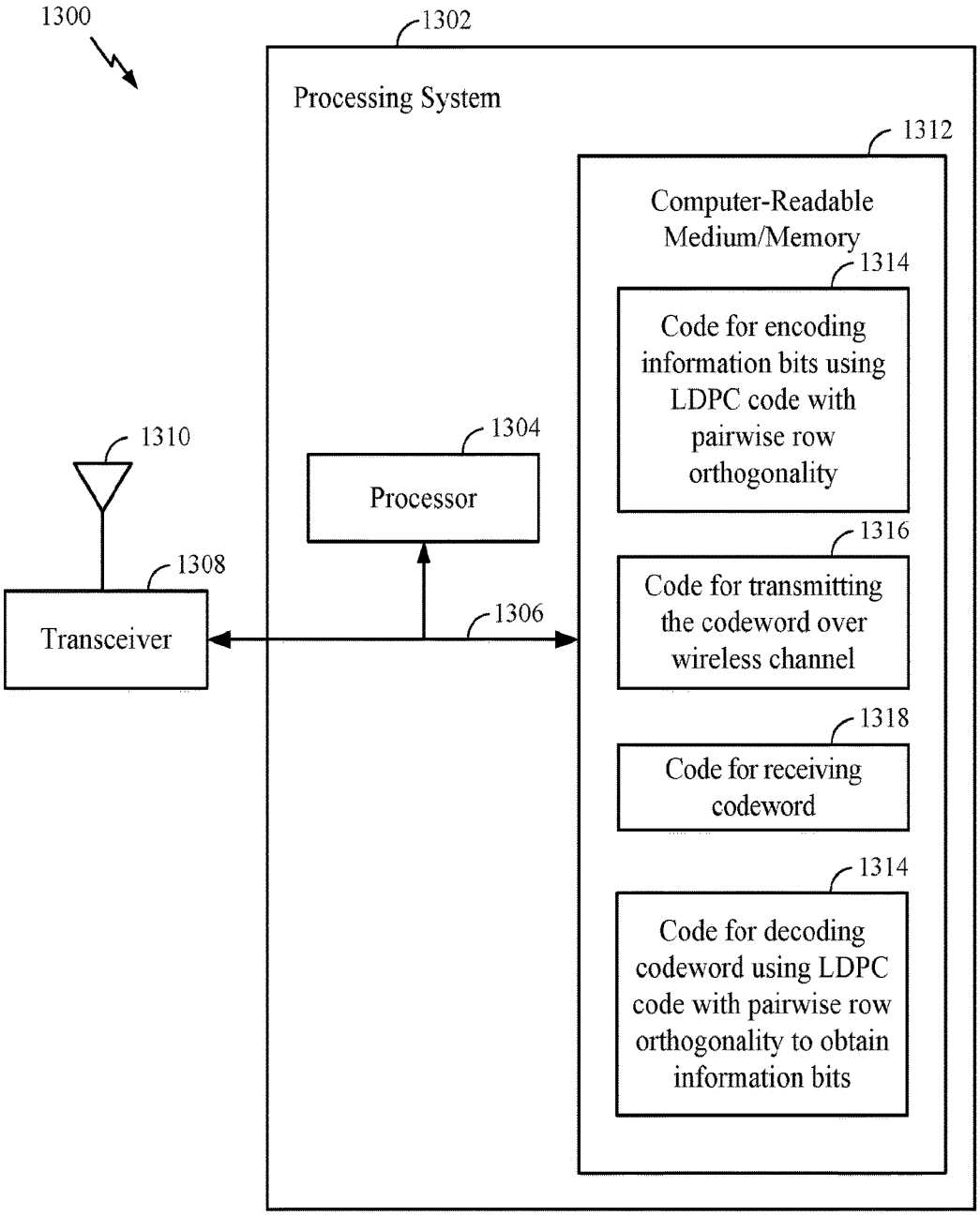
FIG. 13 illustrates a communications device that may include various components configured to perform operations for the techniques disclosed herein in accordance with aspects of the present disclosure.
Figure 14:
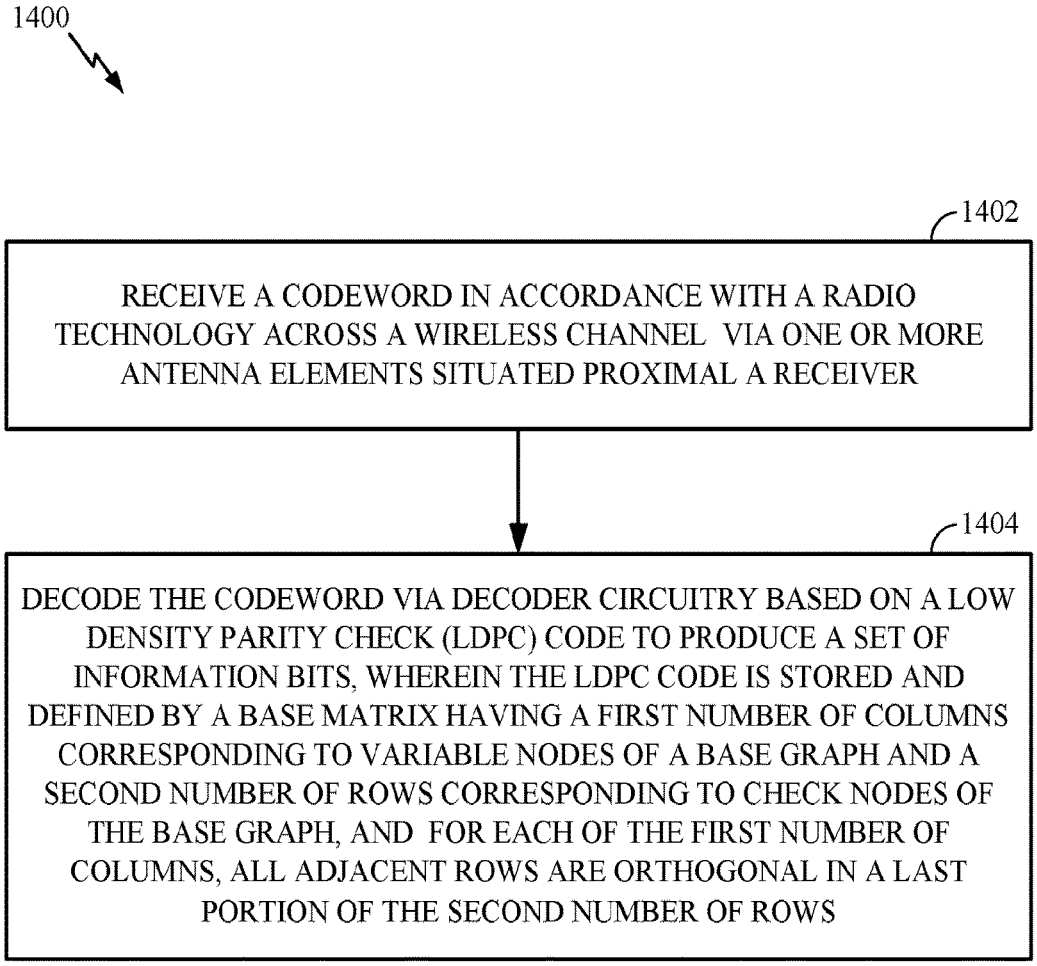
FIG. 14 is a flow diagram illustrating example operations for wireless communications by a receiving device using LDPC coding, in accordance with certain aspects of the present disclosure.
Figure 15:
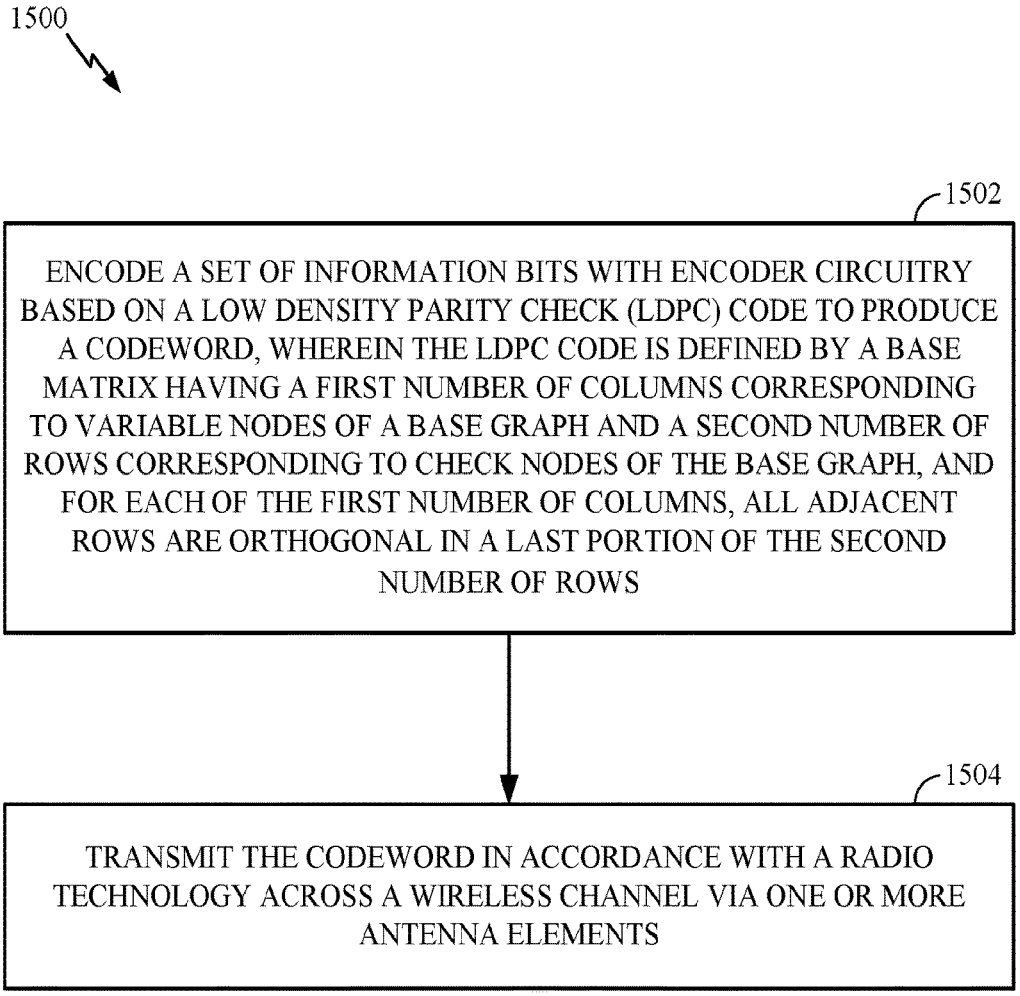
FIG. 15 is a flow diagram illustrating example operations for wireless communications by a transmitting device using LDPC coding, in accordance with certain aspects of the present disclosure.

FIG. 13 illustrates a communications device 1300 that may include various components (e.g., corresponding to means-plus-function components) configured to perform operations for the techniques disclosed herein, such as the operations illustrated in FIG. 14 and/or FIG. 15. The communications device 1300 includes a processing system 1302 coupled to a transceiver 1308. The transceiver 1308 is configured to transmit and receive signals for the communications device 1300 via an antenna 1310, such as the various signals as described herein. The processing system 1302 may be configured to perform processing functions for the communications device 1300, including processing signals received and/or to be transmitted by the communications device 1300.

The processing system 1302 includes a processor 1304 coupled to a computer-readable medium/memory 1312 via a bus 1306. In certain aspects. the computer-readable medium/memory 1312 is configured to store instructions (e.g., computer executable code) that when executed by the processor 1304, cause the processor 1304 to perform the operations illustrated in FIG. 14 and/or FIG. 15, or other operations for performing the various techniques discussed herein for LDPC coding with pairwise row orthogonality. In certain aspects, computer-readable medium/memory 1512 stores code 1314 for encoding information bits using LDPC code with pairwise row orthogonality; code 1316 for transmitting the codeword over a wireless channel; code 1318 for receiving a codeword; and code 1320 for decoding the codeword using LDPC code with pairwise row orthogonality to obtain information bits.

FIG. 14 is a flow diagram illustrating example operations 1400 for wireless communications by a receiving device using LDPC coding, in accordance with certain aspects of the present disclosure. The receiving device may be a BS (e.g., such as a BS 110 in the wireless communication network 100) on the uplink or a UE (e.g., such as a UE 120 in the wireless communication network 100) on the downlink.

The operations 1400 begin, at 1402. by receiving a codeword (e.g., or punctured codeword) in accordance with a radio technology (e.g., NR or 5G radio technology) across a wireless channel via one or more antenna elements situated proximal a receiver. At 1404, the receiving device decodes (e.g., with a layered decoder) the codeword (e.g., and depunctures if the codeword is punctured) via decoder circuitry based on a LDPC code to produce a set of information bits. The LDPC code (e.g., or a lifted LDPC code) is stored and defined by a base matrix having a first number of columns corresponding to variable nodes of a base graph and a second number of rows corresponding to check nodes of the base graph. For each of the first number of columns, all adjacent rows are orthogonal in a last portion (e.g., the bottom 21 rows) of the second number of rows. For example, in each of the first number of columns, at most one row of each pair of the adjacent orthogonal rows in the last portion of the rows has an entry. The decoding may be based on a decoding schedule. The decoding schedule may include decoding sequentially row by row in the base matrix or by simultaneously decoding pairs of rows (e.g., an column by column) in the base matrix. The receiving device may select from two combinations of two rows from any three sequential rows in the last portion for the simultaneous decoding pairs of the decoding schedule. The decoding schedule skips for decoding portions of the base matrix that do not contain an associated entry.

FIG. 15 is a flow diagram illustrating example operations 1500 for wireless communications by a transmitting device using LDPC coding, in accordance with certain aspects of the present disclosure. The transmitting device may be a UE (e.g., such as a UE 120 in the wireless communication network 100) on the uplink or a BS (e.g., such as a BS 121 in the wireless communication network 100) on the downlink. The operations 1500 may be complementary to the operations 1400 by the receiving device.

The operations 1500 begin, at 1502. by encoding a set of information bits with encoder circuitry based on a LDPC code to produce a codeword. The LDPC code is defined by a base matrix having a first number of columns corresponding to variable nodes of a base graph and a second number of rows corresponding to check nodes of the base graph. For each of the first number of columns, all adjacent rows are orthogonal in a last portion of the second number of rows. At 1504, the transmitting device transmits the codeword in accordance with a radio technology across a wireless channel via one or more antenna elements.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more."

Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein. For example, instructions for performing the operations described herein and illustrated in FIG. 14 and FIG. 15.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An apparatus for wireless communication, comprising:

a receiver configured to receive a codeword [in accordance with a radio technology across a wireless channel via one or more antenna elements situated proximal the receiver]; and at least one processor coupled with a memory and [comprising decoder circuitry] configured to decode the codeword based on a low density parity check (LDPC) code to produce a set of information bits, wherein:

the LDPC code is stored in the memory and defined by a base matrix having a [first number] *plurality* of columns [corresponding to variable nodes of a base graph] and a [second number] *plurality* of rows [corresponding to check nodes of the base graph, and]*;*

*elements in all adjacent rows of a column are orthogonal,* for each of the [first number] *plurality* of columns, [all adjacent rows are orthogonal] in [a last portion of the second number of] *at least twenty-one* rows *starting from a last row of the base matrix; and*

*each row of the twenty-one rows contains a non-zero element in a first column, of the plurality of columns, with a column index 0, or a non-zero element in a second column, of the plurality of columns, with a column index 1.*

2. The apparatus of claim 1, wherein [entries] *each element* in the base matrix [correspond] *corresponds* to an edge between [the] *a* variable node and [the] *a* check node[,] of [the] *a* base graph[,] associated with the [entry in] base matrix.

3. The apparatus of claim 2, wherein [entries] *each non-zero element* in the base matrix [include] *corresponds to a* cyclic integer lifting [values] *value.*

4. The apparatus of claim 2, wherein in each *column* of the [first number] *plurality* of columns, at most one row of each pair of the adjacent [orthogonal] rows in the [last portion of the] *twenty-one* rows [has an entry] *contains a non-zero element.*

[5. The apparatus of claim 1, wherein the last portion of the rows comprises at least the bottom twenty-one rows of the base matrix. ]

[6. The apparatus of claim 1, wherein the memory is configured to store at least a portion of the LDPC code.]

7. The apparatus of claim 1, wherein the at least one processor includes a layered decoder *configured to decode the codeword.*

8. The apparatus of claim 1, wherein the at least one processor is configured to decode the codeword based on a decoding schedule.

9. The apparatus of claim 8, wherein the [decoding schedule includes decoding] *at least one processor is configured to decode* the codeword [based on the LDPC code by decoding] sequentially row by row in the base matrix or [by] *to* simultaneously [decoding] *decode* pairs of rows in the base matrix *based on the decoding schedule.*

10. The apparatus of claim 9, wherein the at least one processor is configured to select [from two combinations] *a combination* of two rows from any three sequential rows in the [last portion for the simultaneous decoding pairs of the decoding schedule] *twenty-one rows to simultaneously decode.*

11. The apparatus of claim 9, wherein the [row by row or pairs of rows is performed] *at least one processor is further configured to decode sequentially* column by column *in the base matrix.*

12. The apparatus of claim 8, wherein the [decoding schedule includes skipping] *at least one processor is further configured to skip* decoding [portions] *elements* of the base matrix that [do not] contain [an associated entry] *a zero.*

13. The apparatus of claim 1, wherein the LDPC code comprises a lifted LDPC code.

14. The apparatus of claim 1, wherein:

the codeword comprises a punctured codeword[,]*; and* the at least one processor [further] comprises a depuncturer configured to depuncture the codeword[, and the decoding comprises decoding the depunctured codeword].

15. An apparatus for wireless communication, comprising:

at least one processor coupled with a memory and [comprising an encoder circuit] configured to encode a set of information bits based on a low density parity check (LDPC) code to produce a codeword, wherein:

the LDPC code is stored in the memory and defined by a base matrix having a [first number] *plurality* of columns [corresponding to variable nodes of a base graph] and a [second number] *plurality* of rows [corresponding to check nodes of the base graph, and]*;*

*elements in all adjacent rows of a column are orthogonal,* for each of the [first number] *plurality* of columns, [all adjacent rows are orthogonal] in [a last portion of the second number of] *at least* rows *starting from a last row of the base matrix; and*

*each row of the twenty-one rows contains a non-zero element in a first column, of the plurality of columns, with a column index 0, or a non-zero element in a second column, of the plurality of columns, with a column index 1*; and a transmitter configured to transmit the codeword [in accordance with a radio technology across a wireless channel via one or more antenna elements arranged proximal the transmitter].

16. The apparatus of claim 15, wherein [entries] *each element* in the base matrix [correspond] *corresponds* to an edge between [the] *a* variable node and [the] *a* check node[,] of [the] *a* base graph[,] associated with the [entry in] base matrix.

17. The apparatus of claim 16, wherein [entries] *each non-zero element* in the base matrix [are replaced] *corresponds to a* cyclic integer lifting [values] *value*.

18. The apparatus of claim 16, wherein in each *column* of the [first number] *plurality* of columns, at most one row of each pair of the adjacent [orthogonal] rows in the [last portion of the] *twenty-one* rows [has an entry] *contains a non-zero element*.

[19. The apparatus of claim 15, wherein the last portion of the rows comprises at least the bottom twenty-one rows of the base matrix.]

20. The apparatus of claim 15, wherein:

the at least one processor is *further* configured [to lifted the LDPC code by generating] *generate* an integer number of copies of the base matrix[; and the LDPC code comprises a lifted LDPC code] *to lift the LDPC code*.

21. The apparatus of claim 15, wherein:

the at least one processor further comprises a puncturer configured to puncture the codeword, and the [transmitting the codeword comprises transmitting] *transmitter is configured to transmit* the punctured codeword.

22. A method for wireless communication, comprising:

receiving a codeword [in accordance with a radio technology across a wireless channel via one or more antenna elements situated proximal a receiver]; and decoding the codeword [via decoder circuitry] based on a low density parity check (LDPC) code to produce a set of information bits, wherein:

the LDPC code is stored *in a memory* and defined by a base matrix having a [first number] *plurality* of columns [corresponding to variable nodes of a base graph] and a [second number] *plurality* of rows [corresponding to check nodes of the base graph, and]*;*

*elements in all adjacent rows of a column are orthogonal,* for each of the [first number] *plurality* of columns, [all adjacent rows are orthogonal] in [a last portion of the second number of] *at least twenty-one* rows *starting from a last row of the base matrix; and*

*each row of the twenty-one rows contains a non-zero element in a first column, of the plurality of columns, with a column index 0, or a non-zero element in a second column, of the plurality of columns, with a column index 1*.

23. The method of claim 22, wherein in each *column* of the [first number] *plurality* of columns, at most one row of each pair of the adjacent [orthogonal] rows in the [last portion of the] *twenty-one* rows has [an entry] *a non-zero element*.

[24. The method of claim 22, wherein the last portion of the rows comprises at least the bottom twenty-one rows of the base matrix.]

25. The method of claim 22, wherein[: the decoding is based on a decoding schedule; and the ]decoding [schedule] *the codeword* includes decoding the codeword [based on the LDPC code by decoding] sequentially row by row in the base matrix or [by] simultaneously decoding pairs of rows in the base matrix *based on a decoding schedule*.

26. The method of claim 25, further comprising selecting [from two combinations of two] *each pair of the pairs of* rows from any three sequential rows [in] *of* the [last portion for the simultaneous decoding pairs of the decoding schedule] *twenty-one rows to decode*.

27. A method for wireless communication, comprising:

encoding a set of information bits [with encoder circuitry] based on a low density parity check (LDPC) code to produce a codeword wherein:

the LDPC code is *stored in a memory and* defined by a base matrix having a [first number] *plurality* of columns [corresponding to variable nodes of a base graph] and a [second number] *plurality* of rows [corresponding to check nodes of the base graph, and]*;*

*elements in all adjacent rows of a column are orthogonal,* for each of the [first number] *plurality* of columns, [all adjacent rows are orthogonal] in [a last portion of the second number of] *at least twenty-one* rows *starting from a last row of the base matrix; and*

*each row of the twenty-one rows contains a non-zero element in a first column, of the plurality of columns, with a column index 0, or a non-zero element in a second column, of the plurality of columns, with a column index 1*; and transmitting the codeword [in accordance with a radio technology across a wireless channel via one or more antenna elements].

28. The method of claim 27, wherein in each *column* of the [first number] *plurality* of columns, at most one row of each pair of the adjacent [orthogonal] rows in the [last portion of the] *twenty-one* rows [has an entry] *contains a non-zero element*.

[29. The method of claim 27, wherein the last portion of the rows comprises at least the bottom twenty-one rows of the base matrix.]

30. The method of claim 27, further comprising puncturing the codeword, wherein transmitting the codeword comprises transmitting the punctured codeword.

*31. The apparatus of claim 1, wherein each row of the plurality of rows, except the twenty-one rows, contains a non-zero element in the first column, a non-zero element in the second column, or a non-zero element in both the first column and the second column.*

*32. The apparatus of claim 1, wherein:*

*the set of information bits is K information bits, where K is a positive integer;*

*the base matrix is a base matrix H lifted by a lifting factor Z;*

*the plurality of columns consists of V columns corresponding to i variable nodes, where V is 68;*

*the plurality of rows consists of C rows corresponding to j check nodes, where C is 46; and*

*the elements in the base matrix are represented by a row index i and a column index j.*

*33. The apparatus of claim 32, wherein an element $V_{i,j}$ of the base matrix is a non-zero element at least when i=[25], j=[1]; i=[26], j=[0]; i=[27], j=[1]; i=[28], j=[0]; i=[29], j=[1]; i=[30], j=[0]; i=[31], j=[1]; i=[32], j=[0]; i=[33], j=[1]; i=[34], j=[0]; i=[35], j=[1]; i=[36], j=[0]; i=[37], j=[1]; i=[38], j=[0]; i=[39], j=[1]; i=[40], j=[0]; i=[41], j=[1]; i=[42], j=[0]; i=[43], j=[1]; i=[44], j=[0]; i=[45], j=[1].*

*34. The apparatus of claim 33, wherein an element $V_{i,j}$ of the base matrix is further a non-zero element at least when*

*j=[0] and i=[24], i=[22], i=[20], i=[19], i=[17], i=[15], i=[14], i=[13], i=[12], i=[11], i=[9], i=[8], i=[7], i=[6], i=[5], i=[4], i=[3], i=[2], i=[1], i=[0]; and when j=[1] and i=[23], i=[21], i=[20], i=[19], i=[18], i=[16], i=[15], i=[12], i=[11], i=[10], i=[9], i=[8], i=[7], i=[5], i=[4], i=[3], i=[2], i=[0].*

*35. The apparatus of claim 1, wherein:*

*the receiver is configured to receive the codeword in accordance with a radio technology across a wireless channel via one or more antenna elements situated proximal the receiver;*

*the at least one processor is configured to select a combination pairs of rows from any three sequential rows in the twenty-one rows; and*

*the at least one processor comprises decoder circuitry configured to simultaneously decode each pair of rows.*

*36. The apparatus of claim 1, wherein the first column having the column index 0 and the second column having the column index 1 have a highest degree among the plurality of columns, where the first column and the second column have a highest number of non-zero entries among the plurality of columns.*

*37. The apparatus of claim 36, wherein:*

*the codeword comprises a punctured codeword, where systematic bits corresponding to the first column and the second column are punctured; and*

*the at least one processor comprises a depuncturer configured to depuncture the systematic bits corresponding to the first column and the second column.*

*38. The apparatus of claim 15, wherein each row of the plurality of rows, except the twenty-one rows, contains a non-zero element in the first column, a non-zero element in the second column, or a non-zero element in both the first column and the second column.*

*39. The apparatus of claim 15, wherein:*

*the set of information bits is K information bits, where K is a positive integer;*

*the base matrix is a base matrix H lifted by a lifting factor Z;*

*the plurality of columns consists of V columns corresponding to i variable nodes, where V is 68;*

*the plurality of rows consists of C rows corresponding to j check nodes, where C is 46; and*

*the elements in the base matrix are represented by a row index i and a column index j.*

*40. The apparatus of claim 39, wherein an element $V_{i,j}$ of the base matrix is a non-zero element at least when i=[25], j=[1]; i=[26], j=[0]; i=[27], j=[1]; i=[28], j=[0]; i=[29], j=[1]; i=[30], j=[0]; i=[31], j=[1]; i=[32], j=[0]; i=[33], j=[1]; i=[34], j=[0]; i=[35], j=[1]; i=[36], j=[0]; i=[37], j=[1]; i=[38], j=[0]; i=[39], j=[1]; i=[40], j=[0]; i=[41], j=[1]; i=[42], j=[0]; i=[43], j=[1]; i=[44], j=[0]; i=[45], j=[1].*

*41. The apparatus of claim 40, wherein an element $V_{i,j}$ of the base matrix is further a non-zero element at least when j=[0] and i=[24], i=[22], i=[20], i=[19], i=[17], i=[15], i=[14], i=[13], i=[12], i=[11], i=[9], i=[8], i=[7], i=[6], i=[5], i=[4], i=[3], i=[2], i=[1], i=[0]; and when j=[1] and i=[23], i=[21], i=[20], i=[19], i=[18], i=[16], i=[15], i=[12], i=[11], i=[10], i=[9], i=[8], i=[7], i=[5], i=[4], i=[3], i=[2], i=[0].*

*42. The apparatus of claim 15, wherein:*

*the transmitter is configured to transmit the codeword in accordance with a radio technology across a wireless channel via one or more antenna elements situated proximal the transmitter;*

*the at least one processor is configured to select a combination pairs of rows from any three sequential rows in the twenty-one rows; and*

*the at least one processor comprises encoder circuitry configured to simultaneously encode each pair of rows.*

*43. The apparatus of claim 15, wherein the first column having the column index 0 and the second column having the column index 1 have a highest degree among the plurality of columns, where the first column and the second column have a highest number of non-zero entries among the plurality of columns.*

*44. The apparatus of claim 43, wherein the at least one processor comprises a puncturer configured to puncture systematic bits in the codeword corresponding to the first column and the second column.*

*45. The apparatus of claim 1, wherein the receiver is configured to receive the codeword in accordance with a radio technology across a wireless channel via one or more antenna elements situated proximal the receiver.*

*46. The apparatus of claim 15, wherein the transmitter is configured to transmit the codeword in accordance with a radio technology across a wireless channel via one or more antenna elements situated proximal the transmitter.*

* * * * *